United States Patent
Yusuf et al.

(10) Patent No.: US 11,146,245 B2
(45) Date of Patent: Oct. 12, 2021

(54) MODE SUPPRESSION IN ACOUSTIC RESONATORS

(71) Applicant: Qorvo US, Inc., Greensboro, NC (US)

(72) Inventors: Yazid Yusuf, Orlando, FL (US); Mudar AlJoumayly, Casselberry, FL (US); Alfred Gimenez, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/740,667

(22) Filed: Jan. 13, 2020

(65) Prior Publication Data
US 2021/0218385 A1    Jul. 15, 2021

(51) Int. Cl.
*H03H 9/58*     (2006.01)
*H03H 9/60*     (2006.01)
*H03H 3/02*     (2006.01)

(52) U.S. Cl.
CPC .............. *H03H 9/585* (2013.01); *H03H 3/02* (2013.01); *H03H 9/584* (2013.01); *H03H 9/60* (2013.01)

(58) Field of Classification Search
CPC .......... H03H 9/585; H03H 9/584; H03H 3/02; H03H 9/60; H03H 9/0095; H03H 3/08; H03H 2003/0071
USPC ....................... 333/133, 187, 188
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,442,434 A | 4/1984 | Baekgaard |
| 4,577,168 A | 3/1986 | Hartmann |
| 5,291,159 A | 3/1994 | Vale |
| 6,067,391 A | 5/2000 | Land |
| 6,670,866 B2 | 12/2003 | Ellaet et al. |
| 6,714,099 B2 | 3/2004 | Hikita et al. |

(Continued)

FOREIGN PATENT DOCUMENTS

JP    2012257050 A    12/2012

OTHER PUBLICATIONS

Non-Final Office Action for U.S. Appl. No. 16/283,044, dated Nov. 12, 2020, 9 pages.

(Continued)

*Primary Examiner* — Robert J Pascal
*Assistant Examiner* — Jorge L Salazar, Jr.
(74) *Attorney, Agent, or Firm* — Withrow & Terranova, PLLC

(57) ABSTRACT

Acoustic resonators, such as bulk acoustic wave (BAW) resonators, are disclosed that include mode suppression structures. Acoustic resonators, including stacked crystal filters (SCFs), are disclosed that include spurious mode suppression by modifying a piezoelectric coupling profile within one or more layers of an SCF. Mode suppression configurations may include structures with one or more inverted polarity piezoelectric layers, one or more non-piezoelectric layers, one or more thicker electrodes of the SCF, and combinations thereof. Symmetric input and output electrical response for SCFs with mode suppression configurations may be exhibited by including piezoelectric materials with different electromechanical coupling values and/or by dividing stress profiles differently by configuring different thicknesses for input and output sides of SCFs.

20 Claims, 14 Drawing Sheets

(56) References Cited

U.S. PATENT DOCUMENTS

| | | |
|---|---|---|
| 6,720,844 B1 | 4/2004 | Lakin |
| 6,927,649 B2 | 8/2005 | Metzger et al. |
| 6,927,651 B2 | 8/2005 | Larson, III et al. |
| 6,975,183 B2 | 12/2005 | Aigner et al. |
| 7,057,478 B2 | 6/2006 | Korden et al. |
| 7,173,504 B2 | 2/2007 | Larson, III et al. |
| 7,239,067 B2 | 7/2007 | Komuro et al. |
| 7,321,183 B2 | 1/2008 | Ebuchi et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,515,018 B2 * | 4/2009 | Handtmann ......... H03H 9/0095 333/133 |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Inoue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,929,716 B2 | 3/2018 | Lee et al. |
| 10,009,001 B2 | 6/2018 | Jiang et al. |
| 10,141,644 B2 | 11/2018 | Khlat et al. |
| 2002/0109564 A1 | 8/2002 | Tsai et al. |
| 2004/0100342 A1 | 5/2004 | Nishihara et al. |
| 2005/0057117 A1 | 3/2005 | Nakatsuka et al. |
| 2005/0093648 A1 | 5/2005 | Inoue |
| 2005/0206476 A1 | 9/2005 | Ella et al. |
| 2006/0091978 A1 | 5/2006 | Wang et al. |
| 2008/0007369 A1 | 1/2008 | Barber et al. |
| 2008/0169884 A1 | 7/2008 | Matsumoto et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0204995 A1 * | 8/2011 | Jamneala ............... H03H 9/587 333/187 |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0113576 A1 | 5/2013 | Inoue et al. |
| 2013/0193808 A1 | 8/2013 | Feng et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2019/0140618 A1 | 5/2019 | Takamine |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |

OTHER PUBLICATIONS

Notice of Allowance for U.S. Appl. No. 15/697,658, dated Nov. 17, 2020, 7 pages.

Advisory Action for U.S. Appl. No. 15/883,933, dated Dec. 31, 2020, 3 pages.

Non-Final Office Action for U.S. Appl. No. 16/290,175, dated Jan. 6, 2021, 14 pages.

Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.

Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.

Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.

Final Office Action for U.S. Appl. No. 15/883,933, dated Oct. 23, 2020, 15 pages.

Notice of Allowance and Examiner-Initiated Interview Summary for U.S. Appl. No. 16/003,417, dated Aug. 5, 2020, 9 pages.

Final Office Action for U.S. Appl. No. 16/290,175, dated Sep. 17, 2020, 13 pages.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, mailed Jun. 15, 2017, 7 pages.

Final Office Action for U.S. Appl. No. 15/275,957, dated Jan. 2, 2018, 7 pages.

Author Unknown, "SAW Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

(56) References Cited

OTHER PUBLICATIONS

Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Aigner, R. et al., "3G-4G-5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.
Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.
Volatier, A. et al., "Technology enhancements for high performance BAW duplexer," IEEE International Ultrasonics Symposium (IUS), Jul. 21-25, 2013, Prague, Czech Republic, IEEE, pp. 761-764.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Non-Final Office Action for U.S. Appl. No. 16/776,738, dated Mar. 4, 2021, 7 pages.
Non-Final Office Action for U.S. Appl. No. 16/806,166, dated Mar. 18, 2021, 6 pages.
U.S. Appl. No. 15/720,706, filed Sep. 29, 2017.
U.S. Appl. No. 16/776,738, filed Jan. 30, 2020.
U.S. Appl. No. 16/806,166, filed Mar. 2, 2020.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.

\* cited by examiner

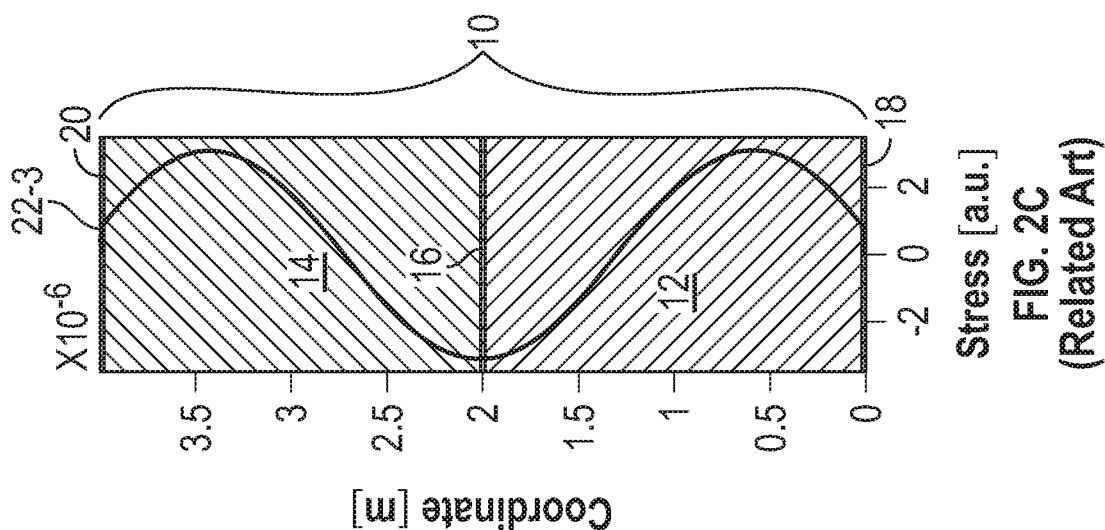
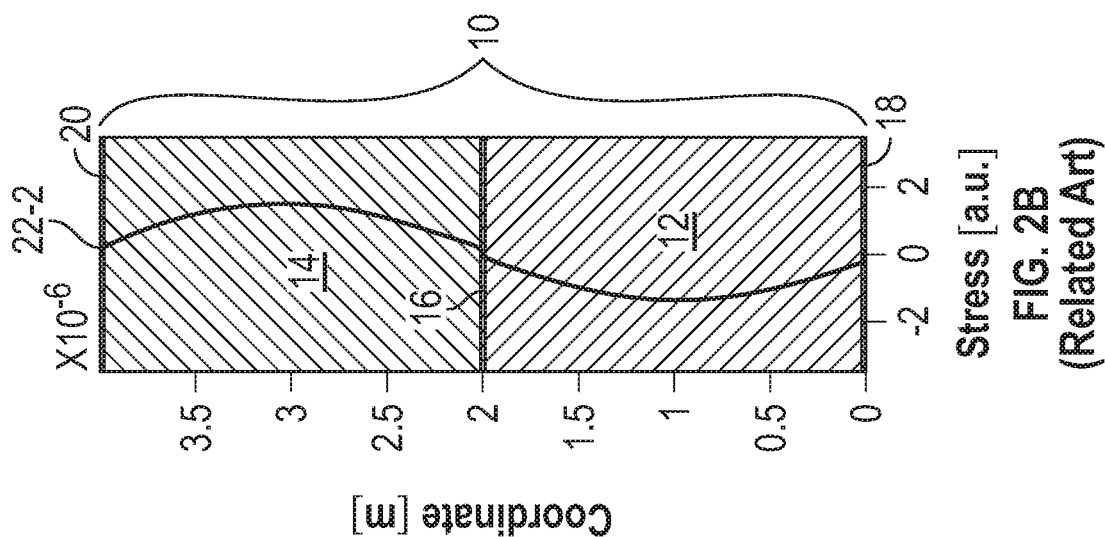
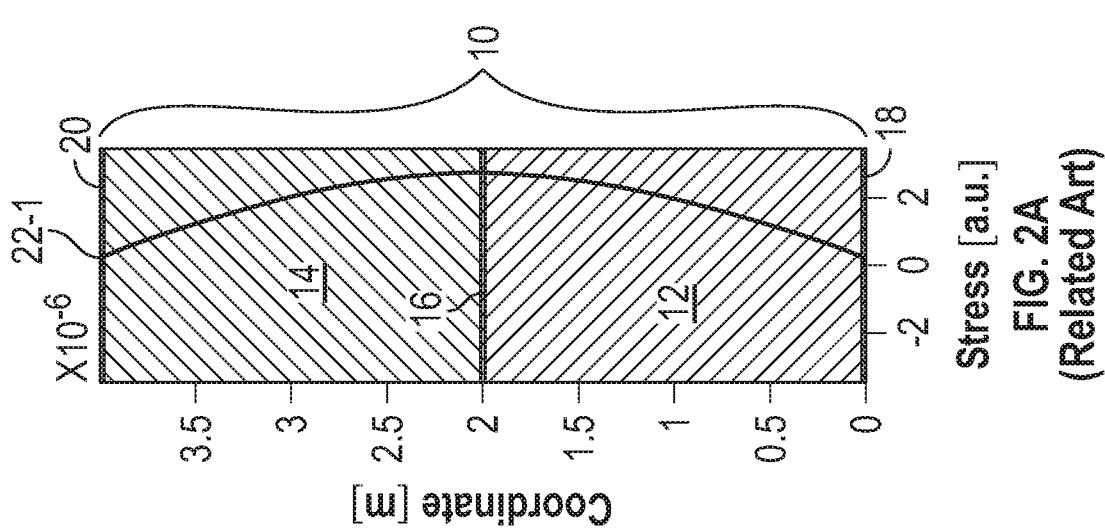

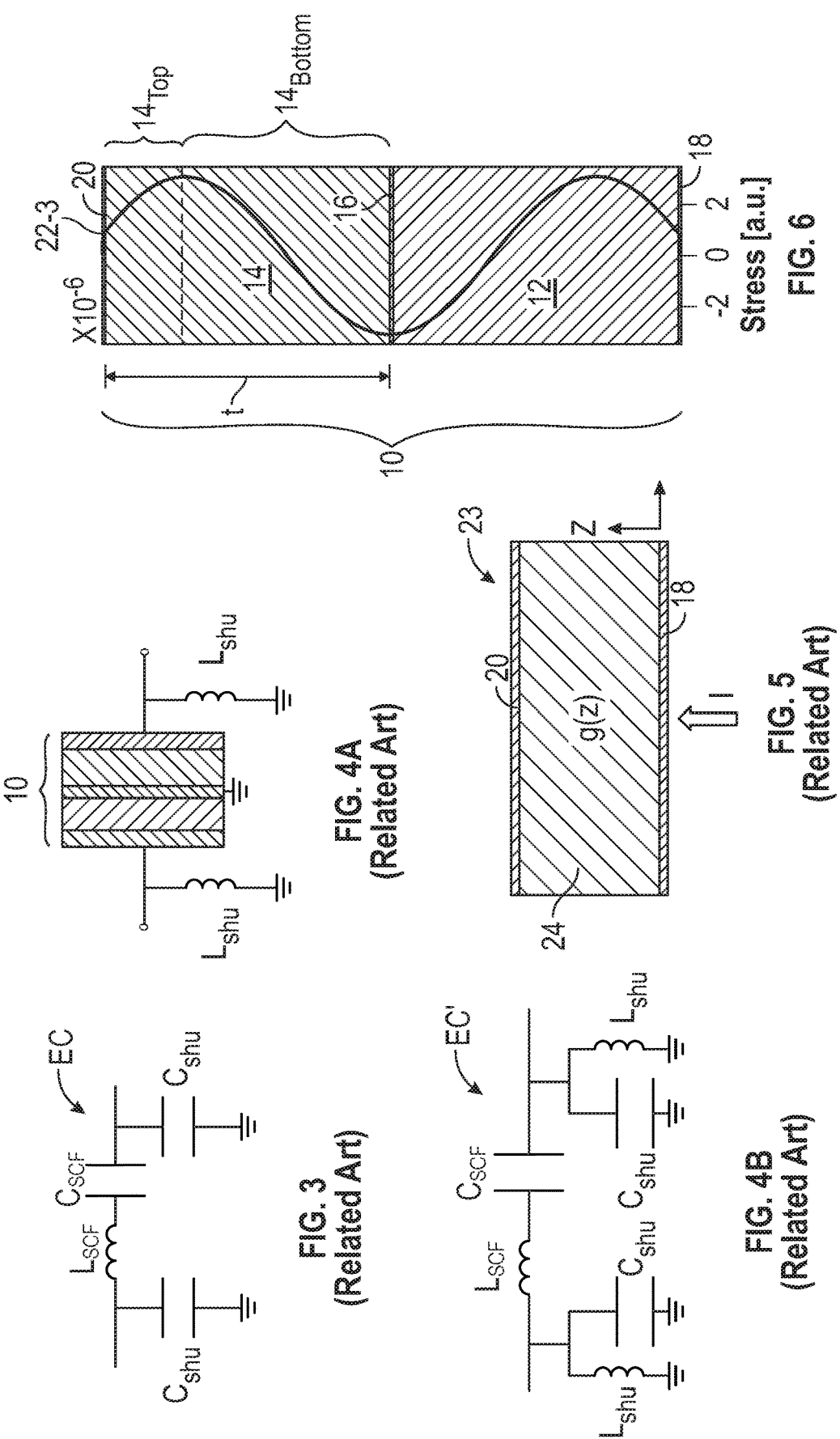

MODE SUPPRESSION IN ACOUSTIC RESONATORS

FIELD OF THE DISCLOSURE

The present disclosure relates to acoustic resonators, such as bulk acoustic wave (BAW) resonators and, in particular, to mode suppression in acoustic resonators including stacked crystal filters (SCFs).

BACKGROUND

Wireless communication networks have continued to evolve in order to keep up with ever increasing data transmission demands of modern technology. With each new generation of cellular network technology, higher integration and smaller device sizes are needed to provide improved data capacity, connectivity, and coverage. As modern mobile communication systems are developed with increased complexity, high performance acoustic resonators are increasingly used as filters in such systems.

Acoustic filters, including bulk acoustic wave (BAW) resonators, are sometimes arranged in ladder network topologies that exhibit many desirable features, but can also provide limited operating bandwidths. Other acoustic filter configurations such as stacked crystal filters (SCFs) and coupled resonator filters (CRFs) can provide larger operating bandwidths. SCFs, as compared with CRFs, may typically have simpler configurations including fewer layers which can provide somewhat easier fabrication.

In such acoustic filters, degraded filter rejections can be caused by spurious resonances or spurious modes that are excited at certain frequencies. Spurious modes may be addressed by making use of the finite bandwidth of reflector structures in a solidly mounted resonator (SMR) configuration. Such reflector structures can include reflector layers that are designed to have suitable reflectivity within a desired filter bandwidth and are also designed to be lossy in filter stopbands, particularly at frequencies of spurious responses. Using this approach, many reflector layers are usually needed to obtain the desired reflector selectivity. Moreover, in filter configurations where multiple SCF structures with different frequencies are typically used, the spurious responses of the multiple SCFs tend not to overlap. As such, a single reflector structure may not be able to suppress spurious responses of all SCFs simultaneously. As advancements in mobile communication systems progress, the art continues to seek improved acoustic resonators and filter configurations capable of overcoming such challenges.

SUMMARY

The present disclosure relates to acoustic resonators, such as bulk acoustic wave (BAW) resonators and, in particular, to mode suppression in acoustic resonators. Acoustic resonators, including stacked crystal filters (SCFs), are disclosed that include spurious mode suppression by modifying a piezoelectric coupling profile within one or more layers of an SCF. Mode suppression configurations may include structures with one or more inverted polarity piezoelectric layers, one or more non-piezoelectric layers, one or more thicker electrodes of the SCF, and combinations thereof. Symmetric input and output electrical response for SCFs with mode suppression configurations may be exhibited by including piezoelectric materials with different electromechanical coupling values and/or by dividing stress profiles differently by configuring different thicknesses for input and output sides of SCFs.

In one aspect, an acoustic resonator comprises: a first piezoelectric layer; a second piezoelectric layer; a shared electrode between the first piezoelectric layer and the second piezoelectric layer; a first electrode on the first piezoelectric layer opposite the shared electrode; a second electrode on the second piezoelectric layer opposite the shared electrode; and a third piezoelectric layer between the second electrode and the shared electrode, the third piezoelectric layer having a polarity that is opposite a polarity of the second piezoelectric layer.

In certain embodiments, the third piezoelectric layer is between the second electrode and the second piezoelectric layer. In certain embodiments, the third piezoelectric layer is between the shared electrode and the second piezoelectric layer. In certain embodiments, the second piezoelectric layer has a higher electromechanical coupling than the first piezoelectric layer. In certain embodiments, the first piezoelectric layer has a higher electromechanical coupling than the second piezoelectric layer. In certain embodiments, the acoustic resonator further comprises a fourth piezoelectric layer between the first electrode and the shared electrode, the fourth piezoelectric layer having a polarity that is opposite a polarity of the first piezoelectric layer. In certain embodiments, the fourth piezoelectric layer is between the shared electrode and the first piezoelectric layer.

In certain embodiments, the third piezoelectric layer has a different thickness than the fourth piezoelectric layer. In certain embodiments, a combined thickness of the first piezoelectric layer and the fourth piezoelectric layer is different than a combined thickness of the third piezoelectric layer and the second piezoelectric layer. In certain embodiments, the first piezoelectric layer has a different thickness than the second piezoelectric layer.

In certain embodiments, the third piezoelectric layer is between the second electrode and the second piezoelectric layer. In certain embodiments, the fourth piezoelectric layer is between the first electrode and the first piezoelectric layer. In certain embodiments, the fourth piezoelectric layer is between the first piezoelectric layer and the first electrode and the third piezoelectric layer is between the second electrode and the second piezoelectric layer. In certain embodiments, the first piezoelectric layer has a different thickness than the second piezoelectric layer.

In another aspect, an acoustic resonator comprises: a first piezoelectric layer; a second piezoelectric layer; a shared electrode between the first piezoelectric layer and the second piezoelectric layer; a first electrode on the first piezoelectric layer opposite the shared electrode; a second electrode on the second piezoelectric layer opposite the shared electrode; and a non-piezoelectric layer between the first electrode and the second electrode. In certain embodiments, the non-piezoelectric layer comprises a dielectric layer. In certain embodiments, the dielectric layer comprises silicon dioxide or silicon nitride. In certain embodiments, the non-piezoelectric layer is between the second electrode and the second piezoelectric layer. In certain embodiments, the non-piezoelectric layer is between the first electrode and the first piezoelectric layer. In certain embodiments, the shared electrode is a metal layer.

In another aspect, an acoustic resonator comprises: a first piezoelectric layer; a second piezoelectric layer; a shared electrode between the first piezoelectric layer and the second piezoelectric layer; a first electrode on the first piezoelectric layer opposite the shared electrode; and a second electrode on the second piezoelectric layer opposite the shared electrode, wherein the second electrode is thicker than the first electrode. In certain embodiments, the second electrode is at least fifty percent thicker than the first electrode. In certain embodiments, the second electrode is at least two times thicker than the first electrode.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A-2C illustrate stress profiles for three order modes of FIG. 1B.

FIG. 3 illustrates an equivalent circuit of the SCF of FIG. 1A about the second order mode of FIG. 2B.

FIG. 4A illustrates the SCF of FIG. 1A with shunt inductors arranged to compensate for shunt capacitances.

FIG. 4B illustrates the equivalent circuit of FIG. 4A.

FIG. 5 is an illustration of a slab of piezoelectric material with a varying electromechanical coupling along the z-axis.

FIG. 6 illustrates the stress profile of the third order mode as illustrated in FIG. 2C with a horizontal dashed line superimposed to separate the second piezoelectric layer into top and bottom portions.

DETAILED DESCRIPTION

Figure 1A:
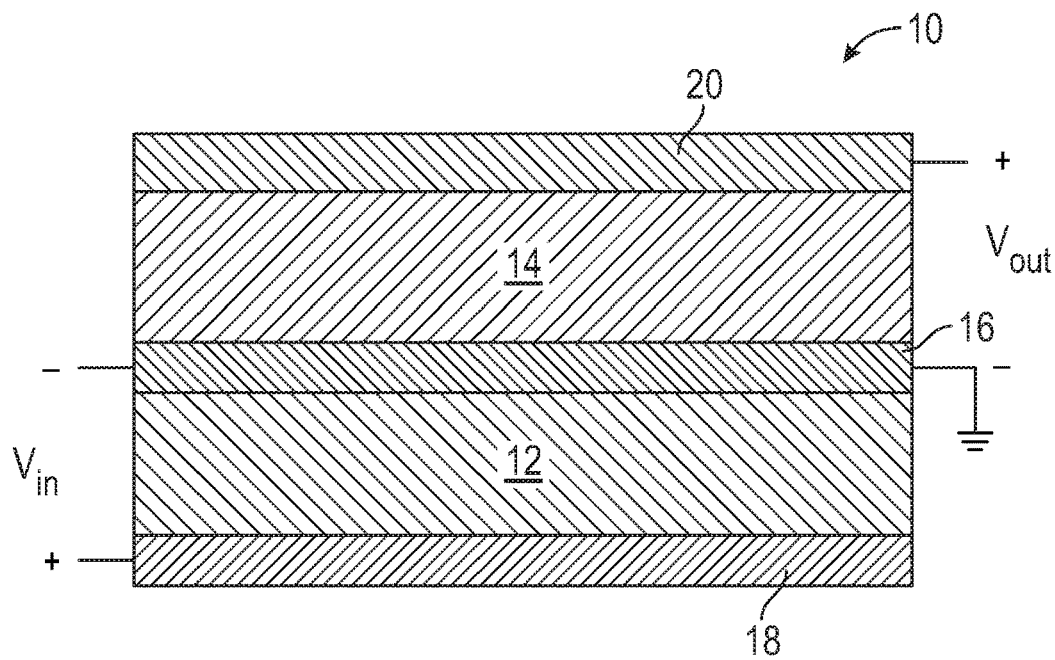
FIG. 1A is a diagram illustrating a typical stacked crystal filter (SCF).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to acoustic resonators, such as bulk acoustic wave (BAW) resonators and, in particular, to mode suppression in acoustic resonators. Acoustic resonators, including stacked crystal filters (SCFs), are disclosed that include spurious mode suppression by modifying a piezoelectric coupling profile within one or more layers of an SCF. Mode suppression configurations may include structures with one or more inverted polarity piezoelectric layers, one or more non-piezoelectric layers, one or more thicker electrodes of the SCF, and combinations thereof. Symmetric input and output electrical response for SCFs with mode suppression configurations may be exhibited by including piezoelectric materials with different electromechanical coupling values and/or by dividing stress profiles differently by configuring different thicknesses for input and output sides of SCFs.

Figure 1B:
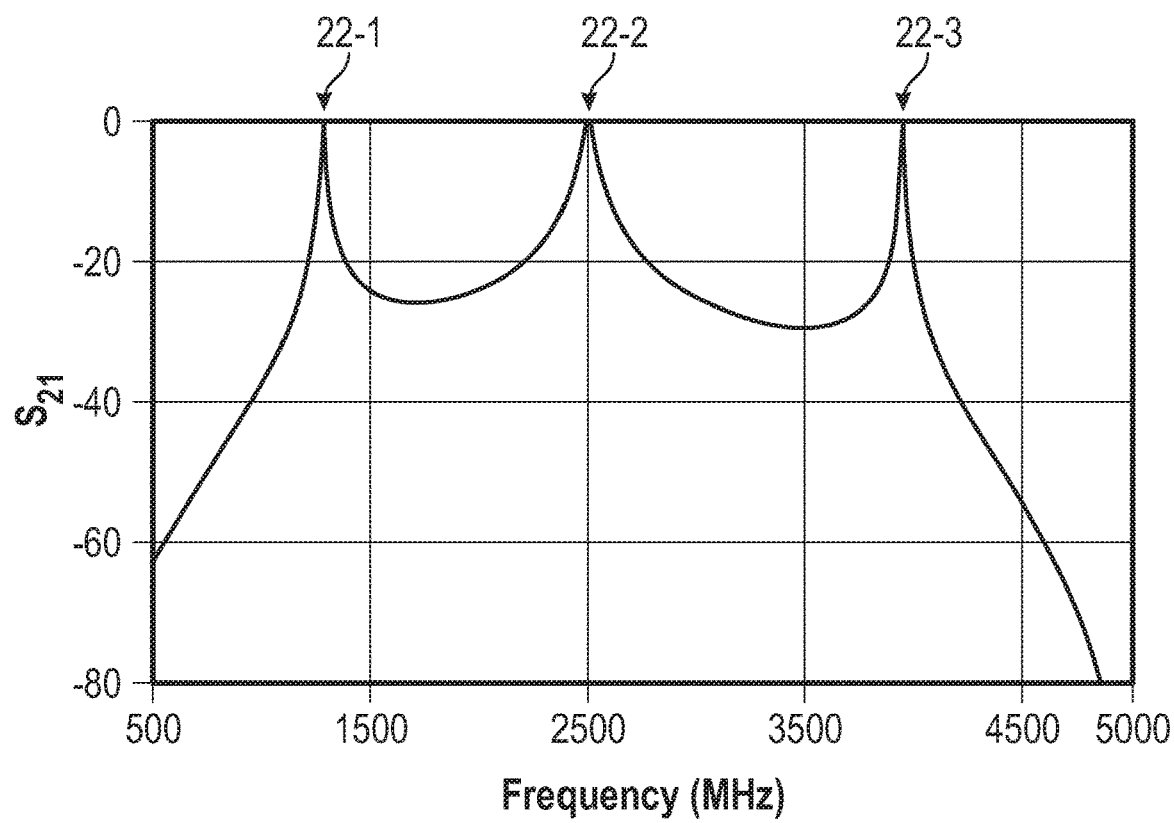
FIG. 1B illustrates a transmission response of the SCF of FIG. 1A exhibiting multiple modes formed along a frequency range.

BAW resonators in stacked crystal filters (SCFs) are used in many high-frequency filter applications. FIG. 1A is a diagram illustrating a typical SCF 10. The SCF 10 includes first and second piezoelectric layers 12, 14 with a shared electrode 16 serving as a common ground plane that acoustically couples the first and second piezoelectric layers 12, 14. A first electrode 18 is arranged on the first piezoelectric layer 12 and a second electrode 20 is arranged on the second piezoelectric layer 14. In FIG. 1A, a voltage applied across input terminals arranged at the first electrode 18 and the shared electrode 16 induces an acoustic wave which couples into the second piezoelectric layer 14 through the shared electrode 16 forming a standing wave in the full structure. It should be understood that the input terminals may alternatively be arranged at the second electrode 20 and the shared electrode 16. In operation, the SCF 10 exhibits multiple modes corresponding to the different eigenfunctions the SCF 10 supports. FIG. 1B illustrates a typical transmission response of the SCF 10 of FIG. 1A exhibiting multiple modes 22-1 to 22-3 formed along the frequency range. The three main peaks in the transmission response correspond to the modes 22-1 to 22-3 that are excited at progressively increasing frequencies. In this regard, the modes may be referred to as order modes where a first mode 22-1 is a first order mode, a second mode 22-2 is a second order mode, a third mode 22-3 is a third order mode, and so on.

FIGS. 2A-2C respectively illustrate the stress profiles for each of the three modes 22-1 to 22-3 of FIG. 1B for the SCF 10. For simplicity, very thin electrodes have been used. In FIG. 2A, the stress profile of the first mode 22-1 exhibits approximately a half wavelength through the SCF 10. In FIG. 2B, the stress profile of the second mode 22-2 exhibits approximately a full wavelength through the SCF 10. In FIG. 2C, the stress profile of the third mode 22-3 exhibits approximately one and a half wavelength through the SCF 10.

FIG. 3 illustrates an equivalent circuit EC of the SCF 10 about the second mode 22-2 of FIG. 2B which is most commonly utilized in applications. The equivalent circuit EC includes an SCF inductance $L_{SCF}$ and an SCF capacitance $C_{SCF}$. Shunt capacitances $C_{SHU}$ on either side represent static capacitances of the piezoelectric layers (12, 14 of FIG. 1A). FIG. 4A illustrates the SCF 10 with shunt inductors $L_{shu}$ arranged to compensate for such shunt capacitances, and FIG. 4B illustrates an equivalent circuit EC' of the SCF 10 with the shunt inductors $L_{shu}$ of FIG. 4A. As such, the circuit may behave as a series resonant circuit about the resonant frequency while exhibiting a symmetric electrical response ($S_{11}=S_{22}$). Depending on the application, this symmetry may or may not be needed.

In order to understand principles of operation according to embodiments disclosed herein, a brief description of relevant theory is provided. FIG. 5 is an illustration of a slab 23 of piezoelectric material 24 with a varying electromechanical coupling along the z-axis. The slab 23 is assumed to be excited with a current I. The governing equations are Newton's second law, and the definition of strain in one dimension. Assuming $e^{j\omega t}$ time dependency, the equations may be expressed according to Equations (1), (2):

$$\frac{dT}{dz} = -\omega^2 \rho u, \quad S = \frac{du}{dz} \qquad (1), (2)$$

Where T and S are the stress and strain respectively, and u is the mechanical displacement. ρ is the mass density of the piezoelectric material 24. Since it is assumed that no free charges exist in the piezoelectric material 24, Gauss law dictates that the derivative of the electric displacement $$D, \frac{dD}{dz} = \rho_v = 0,$$

or equivalently, D=constant. D is related to the current I by I=jωAD, where A is the area of the slab. A convenient form of piezoelectric constitutive equations may be expressed according to Equations (3), (4):

$$S = s^D T + gD, \quad E = -gT + \beta^T D \quad (3),(4)$$

which uses T and D as independent variables. Here, g accounts for the coupling between the electrical and acoustic domains. By combining the above relations, the second order differential equation can be expressed according to Equation (5):

$$\frac{d^2 T}{dz^2} + \omega^2 s^D \rho = \frac{j\omega \rho g(z) I}{A} \quad (5)$$

This is an inhomogeneous equation for the stress T, in which the current and piezoelectric profile g(z) appear in the source term on the right-hand side of the equation. A solution can be obtained by expanding T in terms of the eigenfunctions of the homogenous equation, which satisfy the boundary conditions of zero stress at the piezo-air interface. These eigenfunctions are the mode profiles the structure supports (e.g., the SCF 10 of FIGS. 2A-2C). The stress can be expressed according to Equation (6):

$$T(z) = \Sigma A_n(\omega) \phi_n(z) \quad (6)$$

Utilizing the orthogonality of these eigenfunctions, the amplitude of excitation of the different modes can be expressed according to Equation (7):

$$A_n(\omega) \propto \int g(z) \phi_n(z) dz \quad (7)$$

Stated differently, the degree of excitation of any mode in the piezoelectric material 24 is proportional to the dot product of piezoelectric coupling profile with the mode shape. As such, this property may be utilized to provide acoustic resonator configurations that suppress the excitation of undesired modes according to embodiments disclosed herein.

In certain embodiments, the spurious response of an SCF may be suppressed by modifying the piezoelectric coupling profile within one or more piezoelectric layers of the SCF, thereby providing an excitation profile or coupling profile that is orthogonal to one or more spurious modes that are to be suppressed. In this regard, multiple SCFs may be arranged in a solidly mounted resonator (SMR) configuration that utilizes a single reflector stack, thereby simplifying the fabrication of such filters and allowing improved integration with mobile communication systems. Additionally, SCFs as disclosed herein may also be well suited for incorporation with film bulk acoustic resonator (FBAR) configurations.

FIG. 6 illustrates the stress profile of the third mode 22-3 as illustrated in FIG. 2C where portions of the second piezoelectric layer 14 that correspond to net coupling for the third mode 22-3 are indicated. A horizontal dashed line is superimposed to separate the second piezoelectric layer 14 into a top portion $14_{top}$ and a bottom portion $14_{bottom}$. As illustrated, the net coupling from the bottom portion $14_{bottom}$ is about zero since there are equal positive and negative areas in the stress profile. In this regard, net coupling to the third mode 22-3 is contributed by the top portion $14_{top}$ and excitation of the third mode 22-3 may thereby be suppressed by modifying the piezoelectric coupling profile in the top portion $14_{top}$. Relative thicknesses of the top portion $14_{top}$ and the bottom portion $14_{bottom}$ can vary with different configurations. In certain embodiments, a relative thickness of the top portion $14_{top}$ may comprise a range including 0.1t to 0.5t where t is the thickness of the second piezoelectric layer 14. In certain embodiments, the relative thickness of the top portion $14_{top}$ may comprise a range including 0.2t to 0.4t. In certain embodiments, the relative thickness of the top portion $14_{top}$ may comprise a value of approximately 0.3t with a corresponding value of approximately 0.7t for the bottom portion $14_{bottom}$. With regard to relative thicknesses, the term "approximately" is defined to mean a nominal thickness within +/−five (5) percent of the value. By identifying the portion of the second piezoelectric layer 14 responsible for net coupling of the third mode 22-3, modifications to the piezoelectric coupling profile in the identified portion may be provided to suppress the third mode 22-3.

Figure 7C:
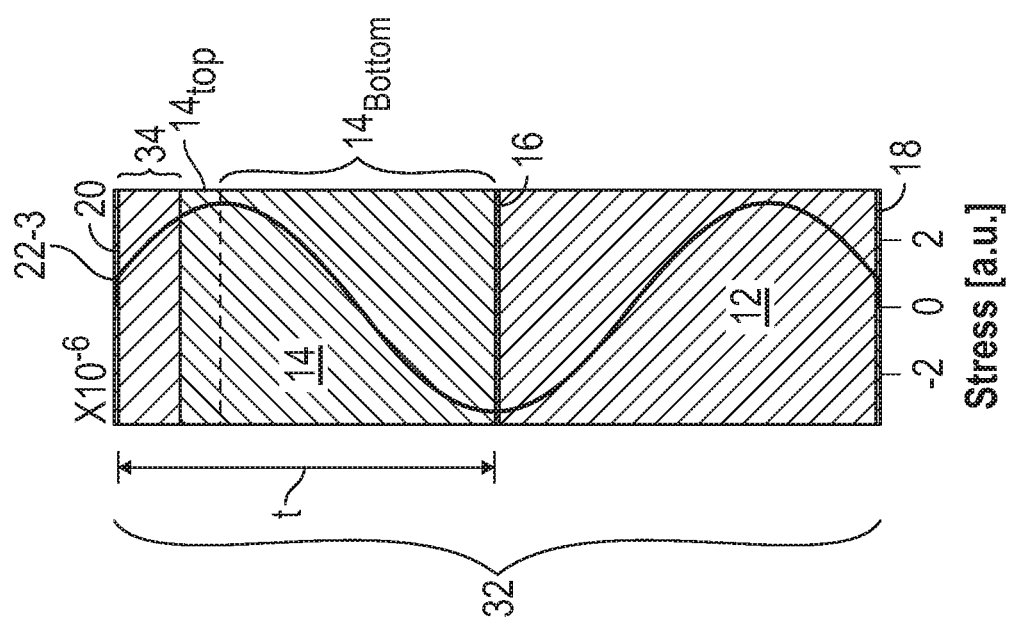
FIG. 7C illustrates the stress profile of the third order mode for an SCF where an inverted piezoelectric layer is arranged for mode suppression.
Figure 7B:
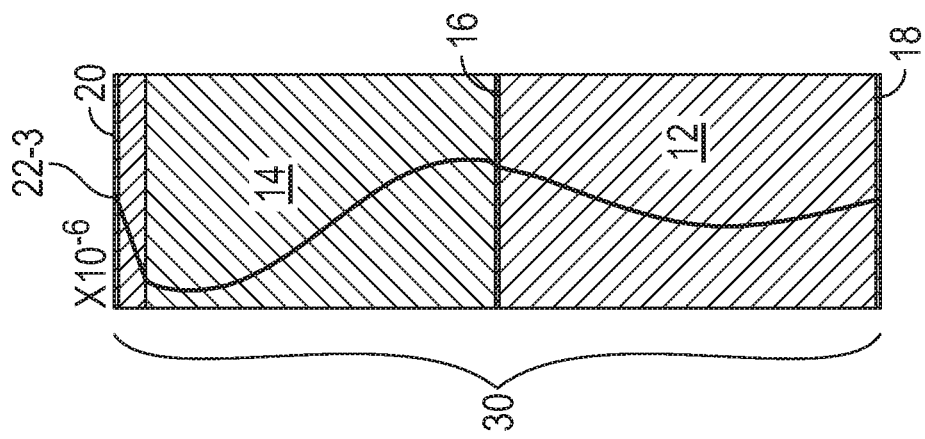
FIG. 7B illustrates a stress profile of the third order mode for an SCF where a second electrode is arranged with increased thickness for mode suppression.
Figure 7A:
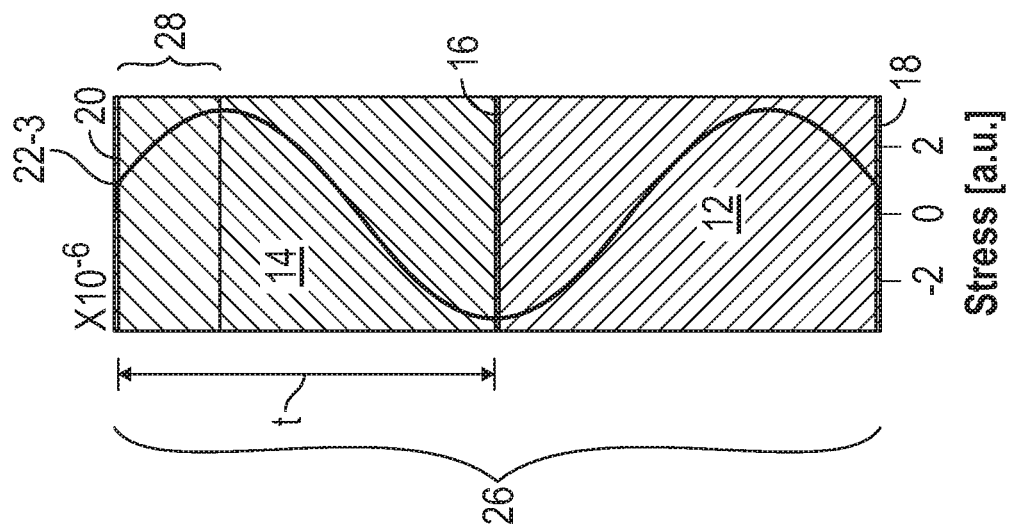
FIG. 7A illustrates the stress profile of the third order mode for an SCF where portions of a second piezoelectric layer are replaced by a non-piezoelectric layer for mode suppression.

FIGS. 7A-7C illustrate SCF configurations that include modifications to the piezoelectric coupling profile for suppression of the third mode 22-3. FIG. 7A illustrates the stress profile of the third mode 22-3 for an SCF 26 where portions of the second piezoelectric layer 14 are replaced by a non-piezoelectric layer 28. In certain embodiments, the non-piezoelectric layer 28 is arranged to replace the top portion $14_{top}$ of the second piezoelectric layer 14 that is responsible for net coupling of the third mode 22-3 as illustrated in FIG. 6. As such, the non-piezoelectric layer 28 may comprise a thickness in a range including 0.1t to 0.5t, or a range 0.2t to 0.4t, or approximately 0.3t depending on the embodiment where t is the thickness between the shared electrode 16 and the second electrode 20. In certain embodiments, the non-piezoelectric layer 28 comprises a dielectric layer or a plurality of dielectric layers, such one or more layers of silicon dioxide ($SiO_2$), silicon nitride (SiN), or combinations thereof. In such arrangements, the non-piezoelectric layer 28 is generally arranged between the first electrode 18 and the second electrode 20 within the SCF 26. More particularly, the non-piezoelectric layer 28 is arranged between the second electrode 20 and the second piezoelectric layer 14 in certain embodiments. In this regard, the second piezoelectric layer 14 is configured to provide about equal positive and negative areas in the stress profile for suppression of the third mode 22-3. In other embodiments and depending on the mode to be suppressed, the non-piezoelectric layer 28 may be arranged in other locations of the SCF 26, such as between the first electrode 18 and the first piezoelectric layer 12.

FIG. 7B illustrates the stress profile of the third mode 22-3 for an SCF 30 where the second electrode 20 is arranged with increased thickness for suppression of the third mode 22-3. Since the second electrode 20 comprises a non-piezoelectric metal layer, the second electrode 20 may accordingly be configured to absorb a portion of the stress profile that corresponds to the third mode 22-3. In particular, the second electrode 20 may be configured with a thickness that is suitable to contain or absorb the portion of the stress profile that corresponds to the top portion $14_{top}$ of the second piezoelectric layer 14 as illustrated in FIG. 6. In this regard, the stress profile of the second piezoelectric layer 14 may be configured to provide about equal positive and negative areas for suppression of the third mode 22-3. In certain embodiments, the second electrode 20 is at least fifty percent thicker than the first electrode 18. In further embodiments, the second electrode 20 is at least two times thicker, or at least three times thicker, or at least four times thicker than the first electrode 18. In other embodiments and depending on the mode to be suppressed, the first electrode 18 may be arranged with increased thickness, with or without the second electrode 20 having increased thickness.

FIG. 7C illustrates the stress profile of the third mode 22-3 for an SCF 32 where an inverted piezoelectric layer is arranged for suppression of the third mode 22-3. As illustrated, the SCF 32 comprises a third piezoelectric layer 34 that is arranged between the first electrode 18 and the second electrode 20. In certain embodiments, the third piezoelectric layer 34 is arranged between the second electrode 20 and the second piezoelectric layer 14. In this manner, the third piezoelectric layer 34 may be configured to at least partially replace the top portion $14_{top}$ of the second piezoelectric layer 14 that is responsible for net coupling of the third mode 22-3 as illustrated in FIG. 6. In certain embodiments, the third piezoelectric layer 34 comprises an inverted polarity piezoelectric layer with regard to the second piezoelectric layer 14. As such, the second piezoelectric layer 14 may have a first polarity and the third piezoelectric layer 34 has a second polarity that is opposite the first polarity. As illustrated in FIG. 7C, the bottom portion $14_{bottom}$ of the second piezoelectric layer 14 has about zero net coupling. The top portion $14_{top}$ contributes a positive coupling and the third piezoelectric layer 34 with inverted polarity contributes a compensating negative coupling for suppression of the third mode 22-3. In certain embodiments, the first and second polarity assignments may be reversed. That is, the second piezoelectric layer 14 (including the top and bottom portions $14_{top}$, $14_{bottom}$) may have the second polarity and the third piezoelectric layer 34 may have the first polarity that is inverted from the second polarity. In such embodiments, the magnitude response of the SCF 32 may be the same while providing a phase change (e.g., 180 degrees). Since the top and bottom halves of the SCF 32 generally operate separately from one another, the polarization of the first piezoelectric layer 12 can be either the first polarity or the second polarity depending on the application. As such, embodiments where the first piezoelectric layer 12 comprises the second polarity may provide a phase change (e.g., 180 degrees) from embodiments where the first piezoelectric layer 12 comprises the first polarity.

In certain embodiments, the first piezoelectric layer 12, the second piezoelectric layer 14, and the third piezoelectric layer 34 may each comprise aluminum nitride (AlN). For example, the first piezoelectric layer 12 and the second piezoelectric layer 14 may each comprise a nitrogen (N) polar layer of AlN while the third piezoelectric layer 34 may comprise an aluminum (Al) polar layer of AlN. In certain embodiments, the second piezoelectric layer 14 and the third piezoelectric layer 34 may be formed by consecutive deposition steps. Said AlN may be undoped or doped with one or more of scandium (Sc), erbium (Er), magnesium (Mg), hafnium (Hf), or the like. In various embodiments, the first electrode 18, the second electrode 20, and the shared electrode 16 may each comprise one or more metals or metal layers such as Al, molybdenum (Mo), tungsten (W), or the like.

In certain embodiments, the third piezoelectric layer 34 may comprise a thickness in a range including 0.1t to 0.5t, or a range 0.2t to 0.4t, or approximately 0.3t, or approximately 0.2t depending on the embodiment, where t is the thickness between the shared electrode 16 and the second electrode 20. In other embodiments and depending on the mode to be suppressed, the third piezoelectric layer 34 may be arranged in other locations of the SCF 32, such as between the first electrode 18 and the first piezoelectric layer 12, or between the shared electrode 16 and the first piezoelectric layer 12, or between the shared electrode 16 and the second piezoelectric layer 14.

Figure 8:
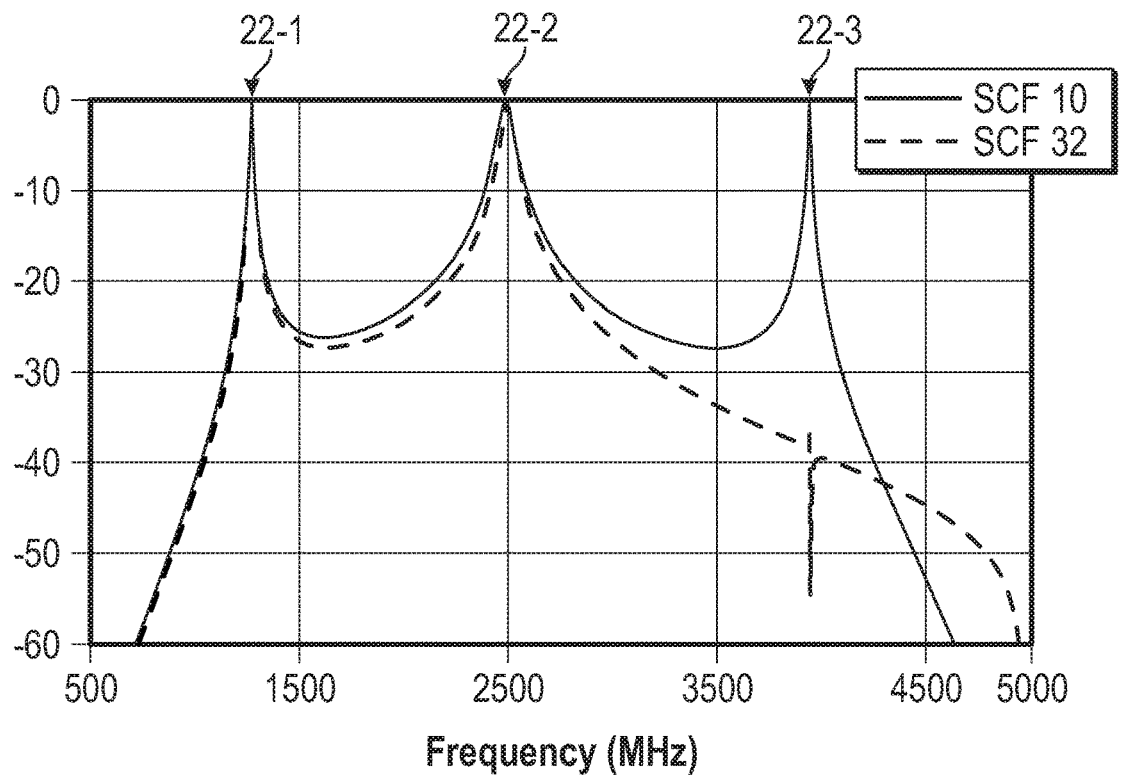
FIG. 8 illustrates a comparison plot for transmission responses of the SCF of FIG. 7C and the SCF of FIG. 1A.

FIG. 8 illustrates a comparison plot for the transmission responses of the SCF 32 of FIG. 7C and the SCF 10 of FIG. 1A. In this regard, the SCF 10 exhibits three main peaks in the transmission response corresponding to the first three modes 22-1 to 22-3 while the SCF 32 exhibits suppression of the third mode 22-3. While not shown in the comparison plot of FIG. 8, the SCF 26 of FIG. 7A and the SCF 30 of FIG. 7B would exhibit plots similar to the SCF 32.

A side effect of suppressing the third mode 22-3 for any of the embodiments described above for FIGS. 7A-7C may include reduced coupling to the desired second mode 22-2 near where mode suppression is implemented. This can result in an asymmetric electrical response where $S_{11}$ is not equal to $S_{22}$. One compensation configuration to restore the symmetry is to implement mode suppression on both halves or sides of the SCF (e.g., on both the first and second piezoelectric layers); however, this may reduce the coupling to both sides of the SCF. Another compensation configuration is to use a higher electromechanical coupling material in or near the piezoelectric material where mode suppression is implemented. Since the higher electromechanical coupling material will generally have different acoustic properties, a different overall thickness of that piezoelectric material may be needed.

Figure 9:
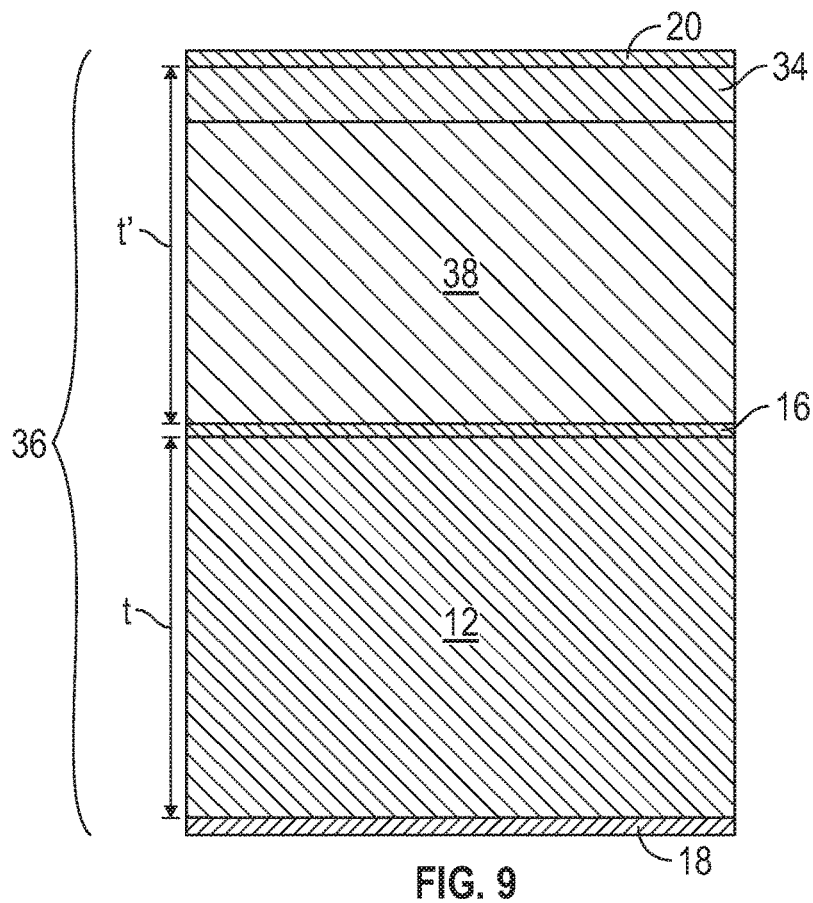
FIG. 9 is a diagram illustrating an SCF that includes a second piezoelectric layer with a higher electromechanical coupling material as compensation for mode suppression.

FIG. 9 is a diagram illustrating an SCF 36 that includes a second piezoelectric layer 38 with a higher electromechanical coupling material as compensation for the mode suppression of the third mode (e.g., 22-3 of FIG. 8). The SCF 36 includes the first electrode 18, the shared electrode 16, and the second electrode 20 as previously described. The first piezoelectric layer 12 is arranged between the first electrode 18 and the shared electrode 16 and the second piezoelectric layer 38 is arranged between the second electrode 20 and the shared electrode 16. The SCF 36 may include any of the third mode (e.g., 22-3 of FIG. 8) suppression configurations described above for FIGS. 7A-7C. By way of example, FIG. 9 includes the third piezoelectric layer 34 as described for FIG. 7C. To compensate for any asymmetric electrical response caused by the mode suppression, the second piezoelectric layer 38 may include a material with a higher electromechanical coupling than the material of the first piezoelectric layer 12. In certain embodiments, the first piezoelectric layer 12 and the second piezoelectric layer 38 may each comprise AlN with different doping levels to provide different higher electromechanical coupling. By way of example, the second piezoelectric layer 38 may comprise a higher doping level (e.g., Sc or the like) than the first piezoelectric layer 12. In certain embodiments, the first piezoelectric layer 12 may be undoped. Due to the differences in acoustic properties between the first piezoelectric layer 12 and the second piezoelectric layer 38, the different halves or sides of the SCF 36 as defined on opposing faces of the shared electrode 16 may be configured with different thickness (t' and t in FIG. 9). In FIG. 9, t is the thickness of the first piezoelectric layer 12 as defined by a distance between the first electrode 18 and the shared electrode 16 while t' is the combined thickness of the third piezoelectric layer 34 and the second piezoelectric layer 38 as defined by a distance between the second electrode 20 and the shared electrode 16. In certain embodiments, the thickness t' of the upper half may configured thinner than the thickness t by reducing a thickness of the second piezoelectric layer 38.

Figure 10A:
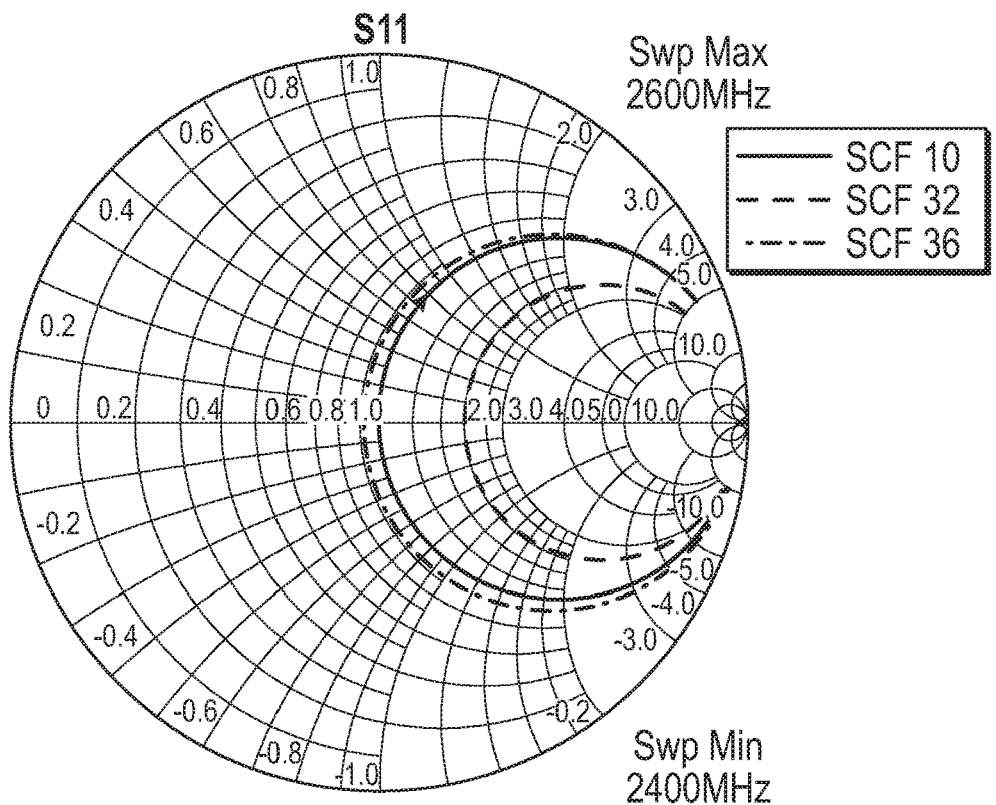
FIG. 10A is a Smith chart comparing impedance for inputs of the SCF of FIG. 1A, the SCF of FIG. 7C, and the SCF of FIG. 9.
Figure 10B:
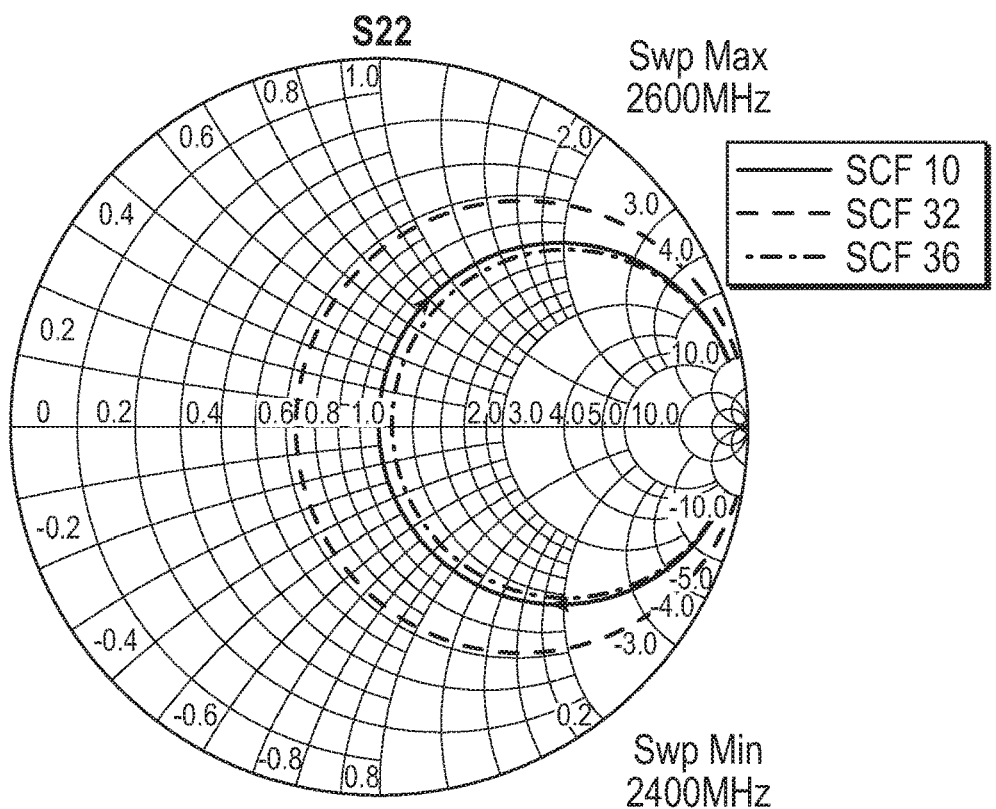
FIG. 10B is a Smith chart comparing impedance for outputs of the SCF of FIG. 1A, the SCF of FIG. 7C, and the SCF of FIG. 9.
Figure 10C:
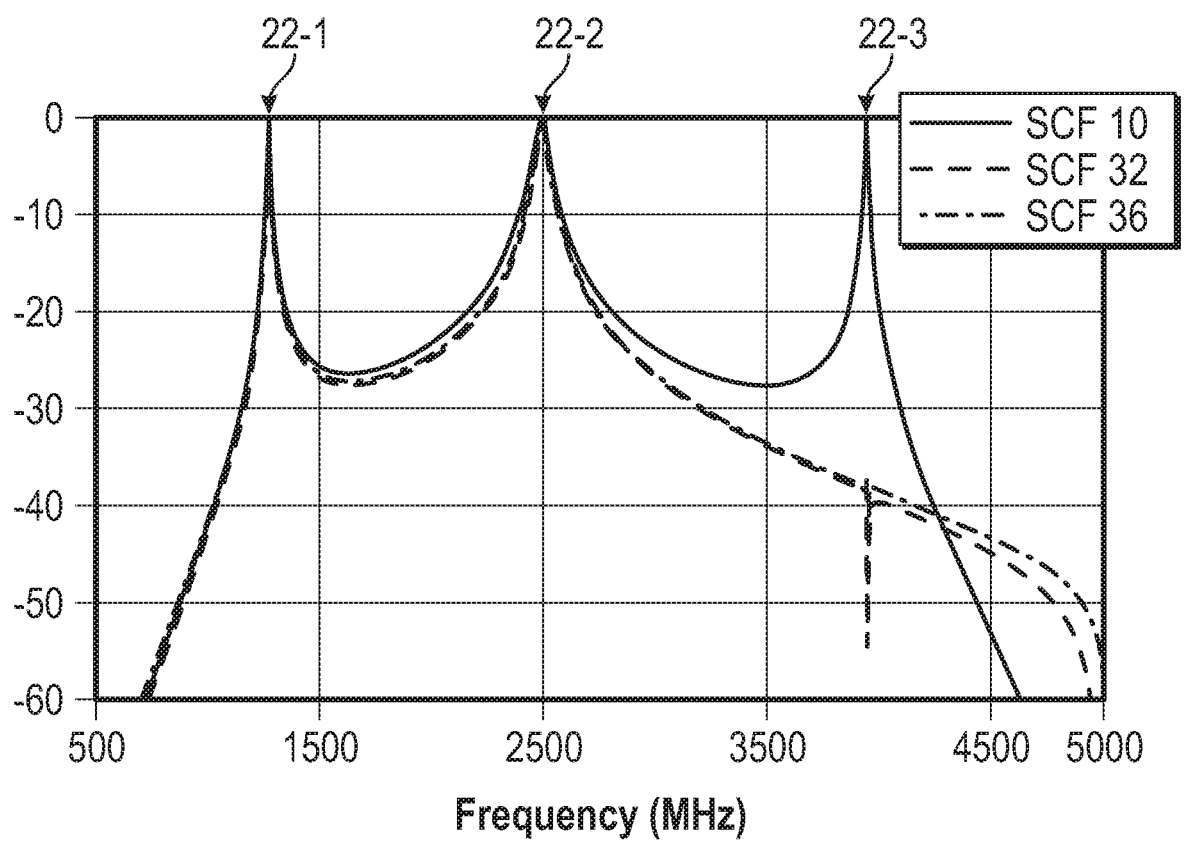
FIG. 10C illustrates a comparison plot for the transmission responses of the SCF of FIG. 1A, the SCF of FIG. 7C, and the SCF of FIG. 9.

FIGS. 10A-10C are plots comparing differences in electrical responses of third mode suppressed SCFs with compensation (e.g., the SCF 36 of FIG. 9) and without compensation (e.g., the SCF 32 of FIG. 7C) and a baseline SCF (e.g., the SCF 10 of FIG. 1A). For the purposes of the comparison of FIGS. 10A and 10B, the top halves of the SCFs 10, 32, 36 are configured as the SCF input and the bottom halves are configured as the SCF output. Additionally, the results are shown for configurations where the static shunt capacitances are compensated as illustrated in FIGS. 4A and 4B. FIG. 10A is a Smith chart comparing impedance for a top half or input of the SCFs 10, 32, 36 by scattering parameter $S_{11}$, and FIG. 10B is a Smith chart comparing impedance for a bottom half or output of the SCFs 10, 32, 36 by scattering parameter $S_{22}$. FIG. 10C illustrates a comparison plot for the transmission responses for the SCFs 10, 32, 36. As illustrated, the SCF 10 is generally symmetric between the input and output of FIGS. 10A and 10B while exhibiting the three modes 22-1 to 22-3. For the configuration where the third mode 22-3 is suppressed without compensation, the SCF 32 is asymmetric between the input and output. As illustrated by the SCF 36, when compensation is added, symmetry may be generally restored while also providing suppression of the third mode 22-3.

While the above-described embodiments illustrate various configurations for suppression of the third mode, the aspects disclosed may be applied to suppress any mode or combination of modes in SCFs. In certain embodiments, SCFs may be configured for suppression of the first mode. In other embodiments, SCFs may be configured for suppression of the first mode and the third mode. In still other embodiments, SCFs may be configured for suppression of the second mode.

Figure 11:
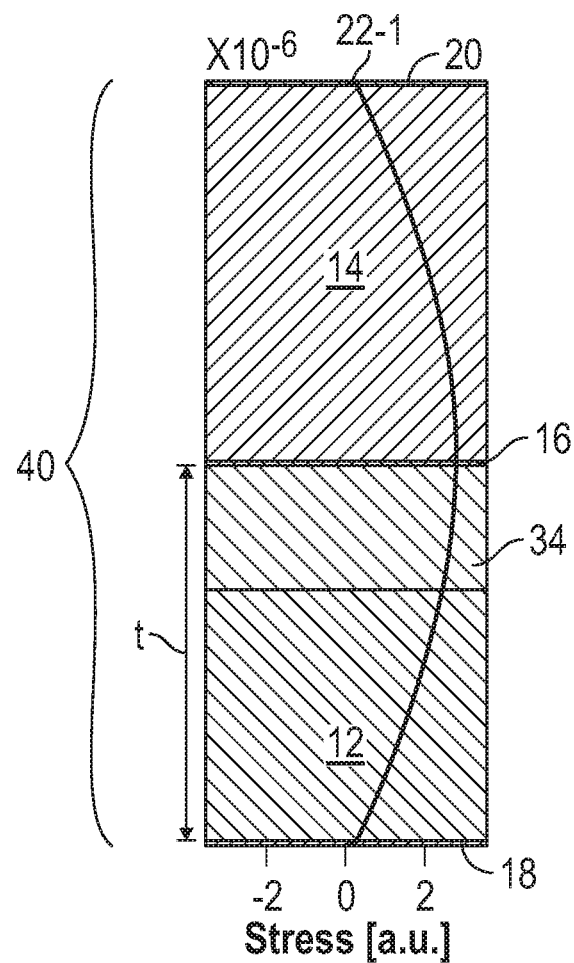
FIG. 11 is a stress profile diagram for the first order mode of an SCF where a third piezoelectric layer having inversed polarity is arranged between a first electrode and a shared electrode for mode suppression.

FIG. 11 is a stress profile diagram for the first mode 22-1 of an SCF 40 where the third piezoelectric layer 34 having inversed polarity is arranged between the first electrode 18 and the shared electrode 16 for suppression of the first mode 22-1. As with previous embodiments, the third piezoelectric layer 34 may comprise a thickness in a range including 0.1t to 0.5t, or a range 0.2t to 0.4t, or approximately 0.3t depending on the embodiment where t is the thickness between the shared electrode 16 and the first electrode 18. By placing the third piezoelectric layer 34 between the first electrode 18 and the shared electrode 16, net zero coupling may be exhibited by the bottom half of the SCF 40 for suppression of the first mode 22-1. In FIG. 11, the third piezoelectric layer 34 is arranged between the shared electrode 16 and the first piezoelectric layer 12. In certain embodiments, the third piezoelectric layer 34 may also reduce coupling of other modes, such as the second mode (22-2 of FIG. 2B) that may be intended as the main mode for the SCF 40. In this regard, the SCF 40 may be compensated by configuring different electromechanical coupling materials and/or different thicknesses for the first piezoelectric layer 12 relative to the second piezoelectric layer 14 as described above. In other embodiments, the third piezoelectric layer 34 may be provided in other locations between the first electrode 18 and the shared electrode 16.

Figure 12:
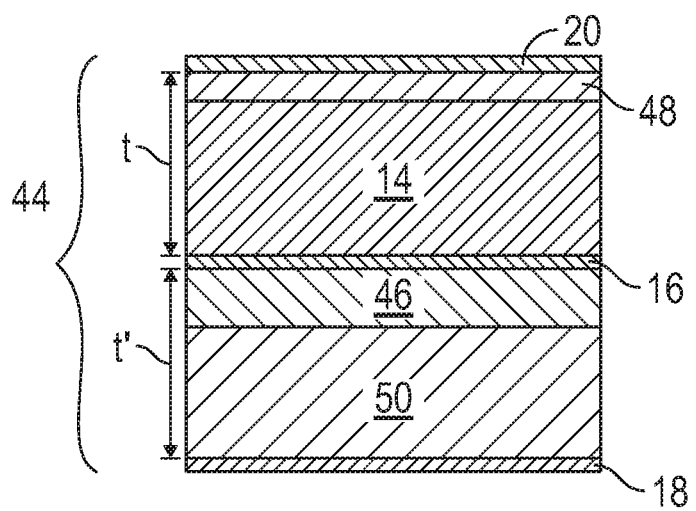
FIG. 12 is a diagram illustrating an SCF that includes mode suppression for the first order mode and the third order mode.

FIG. 12 is a diagram illustrating an SCF 44 that includes mode suppression for the first mode (22-1 of FIG. 2B) and the third mode (22-3 of FIG. 2B). The SCF 44 may include any of the mode suppression configurations described above. By way of example, the SCF 44 includes a fourth piezoelectric layer 46 with an inverted polarity that is arranged between the first electrode 18 and the shared electrode 16 for suppression of the first mode (22-1 of FIG. 2B). The SCF 44 also includes a third piezoelectric layer 48 with an inverted polarity that is arranged between the second electrode 20 and the shared electrode 16 for suppression of the third mode (22-1 of FIG. 2B). To compensate for any asymmetric electrical response caused by the mode suppression, a first piezoelectric layer 50 that is arranged between the first electrode 18 and the shared electrode 16 may include a material with a higher electromechanical coupling than the material of the second piezoelectric layer 14.

Due to the differences in acoustic properties between the first piezoelectric layer 50 and the second piezoelectric layer 14, the different halves or sides of the SCF 44 as defined on opposing faces of the shared electrode 16 may be configured with different thickness (t' and t in FIG. 12). In FIG. 12, t is the combined thickness of the third piezoelectric layer 48 and the second piezoelectric layer 14 as defined by a distance between the second electrode 20 and the shared electrode 16 while t' is the combined thickness of the fourth piezoelectric layer 46 and the first piezoelectric layer 50 as defined by a distance between the first electrode 18 and the shared electrode 16. In certain embodiments, the thickness t' of the lower half may be configured thinner than the thickness t by reducing a thickness of the first piezoelectric layer 50. In certain embodiments, a thickness of the fourth piezoelectric layer 46 needed to suppress the first mode (22-1 of FIG. 2B) may be thicker than a thickness of the third piezoelectric layer 48 needed to suppress the third mode (22-3 of FIG. 2B). By way of example, the fourth piezoelectric layer 46 may have a thickness of approximately 0.3t' while the third piezoelectric layer 48 may have a thickness of approximately 0.2t where 0.3t' is greater than 0.2t. While the inverted polarity configuration is illustrated in the upper half of the SCF 44 to suppress the third mode (22-3 of FIG. 2B), any suppression configuration described above for FIGS. 7A-7C, including non-piezoelectric layers, thicker electrodes, and combinations thereof may be used.

Figure 13:
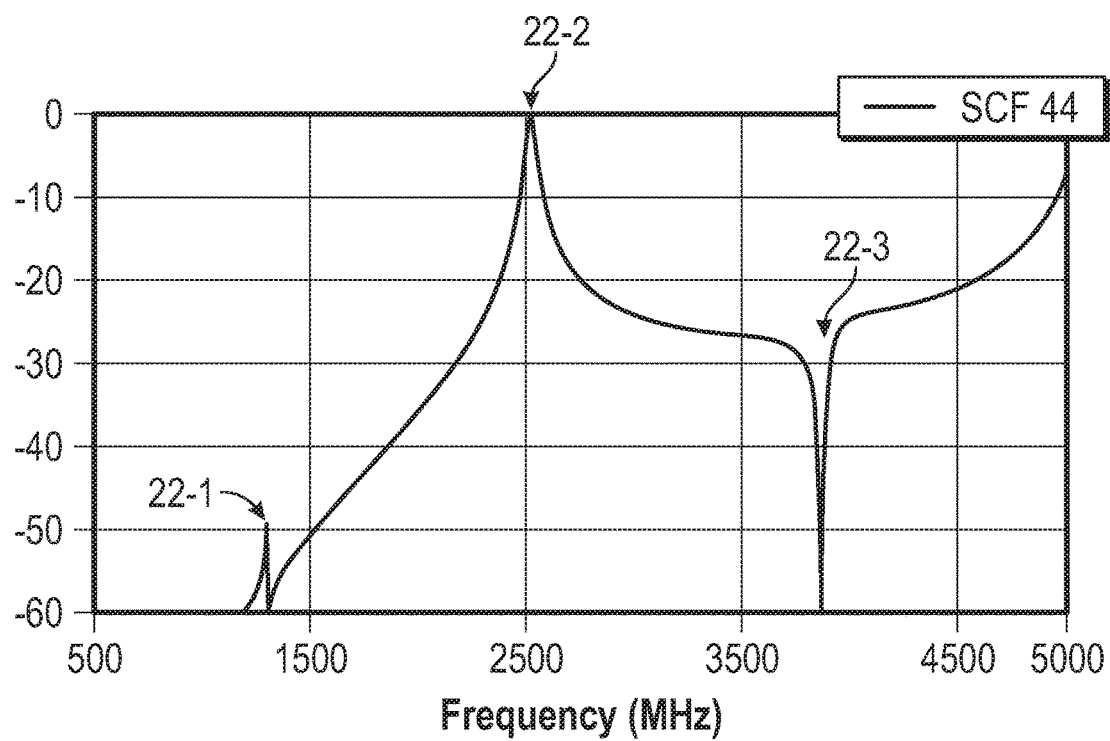
FIG. 13 illustrates the transmission response for the SCF of FIG. 12.

FIG. 13 illustrates the transmission response for the SCF 44 of FIG. 12. As illustrated, the first mode 22-1 and the third mode 22-3 are suppressed with the second mode 22-2 serving as a main mode for the SCF 44.

Figure 14:
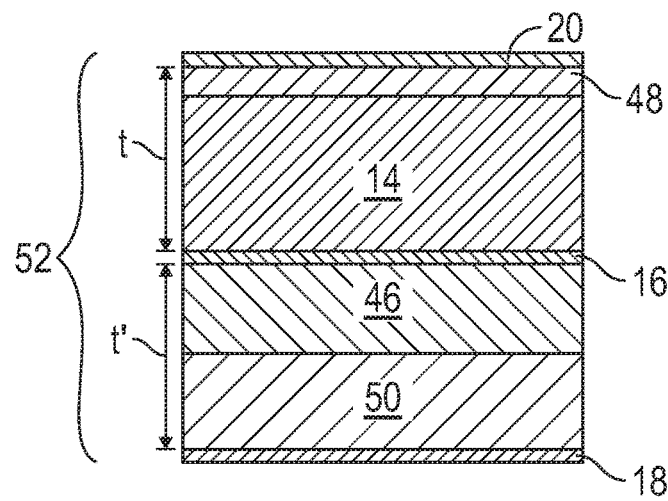
FIG. 14 is a diagram illustrating an SCF that includes mode suppression for the second order mode and the third order mode.

FIG. 14 is a diagram illustrating an SCF 52 that includes mode suppression for the second mode (22-2 of FIG. 2B) and the third mode (22-3 of FIG. 2B). The SCF 52 may include any of the mode suppression configurations described above. By way of example, the SCF 52 is configured similar to the SCF 44 of FIG. 12, but with a thicker fourth piezoelectric layer 46 arranged between the shared electrode 16 and the first piezoelectric layer 50. By increasing a thickness of the fourth piezoelectric layer 46 having inverse polarity, the stress profile of the second mode 22-2 as illustrated in FIG. 2B may exhibit a net zero coupling while the stress profile of the first mode 22-1 as illustrated in FIG. 2A will have a positive value for net coupling. As a result, the second mode 22-2 may be suppressed while the first mode 22-1 is configured as a main mode for the SCF 52. While the inverted polarity configuration is illustrated in the upper half of the SCF 52 to suppress the third mode (22-3 of FIG. 2B), any suppression configuration described above for FIGS. 7A-7C, including non-piezoelectric layers, thicker electrodes, and combinations thereof may be used.

Figure 15:
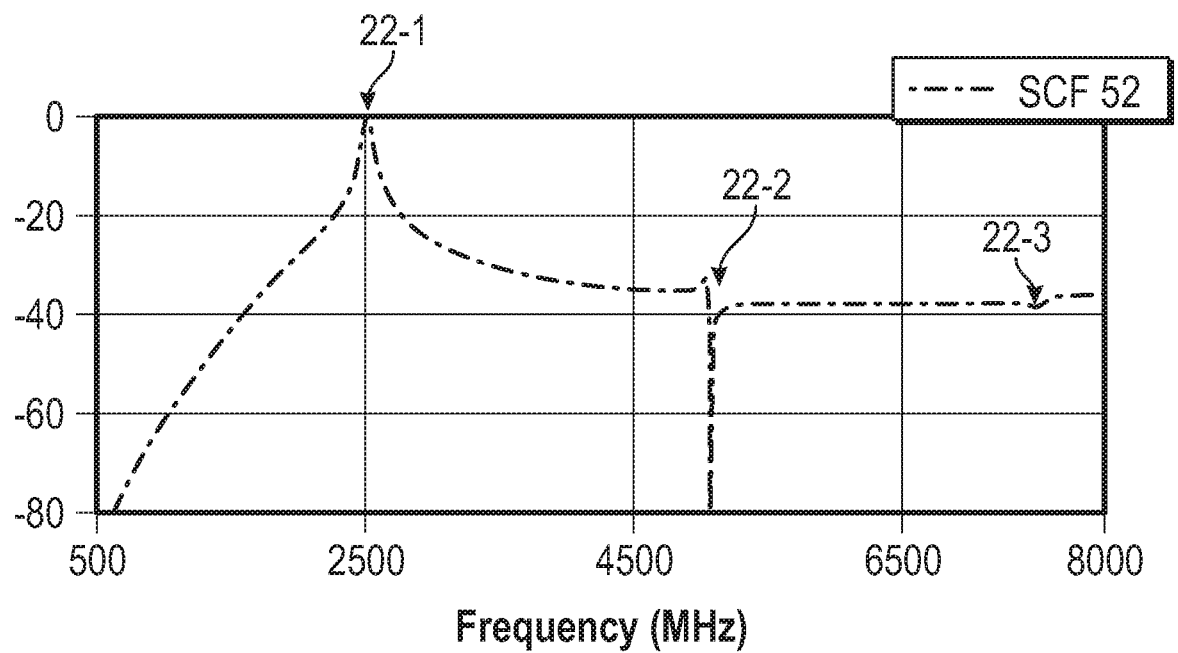
FIG. 15 illustrates the transmission response for the SCF of FIG. 14.

FIG. 15 illustrates the transmission response for the SCF 52 of FIG. 14. As illustrated, the second mode 22-2 and the third mode 22-3 are suppressed with the first mode 22-1 serving as a main mode for the SCF 52. The coupling for the first mode 22-1 may be reduced; however, the above described compensation method of using different coupling values for the piezoelectric layers may be used.

In certain aspects, various mode suppression configurations can provide electrically symmetric responses without the need for compensation configurations. In certain embodiments, SCFs may be configured with top and bottom halves of differing thicknesses such that stress profiles are divided differently between the top and bottom halves. In this regard, the top and bottom halves of an SCF may be configured to suppress different modes while also providing equal coupling to input and output ports. With different thicknesses, the top and bottom halves can accordingly have different shunt capacitances (e.g., FIG. 3), and as such, different compensating inductors may be provided (e.g., FIGS. 4 and 5).

Figure 16:
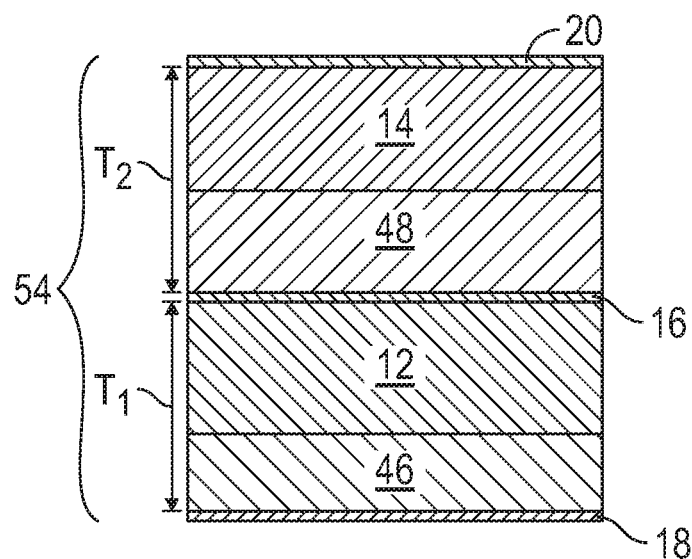
FIG. 16 is a diagram illustrating an SCF that includes mode suppression for the first order mode and the third order mode without requiring compensation configurations.

FIG. 16 is a diagram illustrating an SCF 54 that includes mode suppression for the first mode (22-1 of FIG. 2B) and the third mode (22-3 of FIG. 2B) without requiring compensation configurations. The SCF 54 includes the fourth piezoelectric layer 46 having inverse polarity and the first piezoelectric layer 12 that collectively define a bottom half of the SCF 54. The fourth piezoelectric layer 46 is arranged between the first electrode 18 and the first piezoelectric layer 12 for suppression of the third mode (22-3 of FIG. 2B). The SCF 54 further includes the third piezoelectric layer 48 having inverse polarity and the second piezoelectric layer 14 that collectively define a top half of the SCF 54. The third piezoelectric layer 48 is arranged between the shared electrode 16 and the second piezoelectric layer 14 for suppression of the first mode (22-1 of FIG. 2B).

In order to avoid the need for compensation configurations such as different coupling values for one or more of the piezoelectric layers, the top and bottom halves of the SCF 54 are arranged with different thicknesses. In FIG. 16, $T_1$ is the combined thickness of the fourth piezoelectric layer 46 and the first piezoelectric layer 12 as defined by a distance between the first electrode 18 and the shared electrode 16, and $T_2$ is the combined thickness of the third piezoelectric layer 48 and the second piezoelectric layer 14 as defined by a distance between the second electrode 20 and the shared electrode 16. As such, a total thickness T may be defined as the sum of $T_1$ and $T_2$. In certain embodiments, $T_1$ may be configured with a thickness of approximately 0.45T, and $T_2$ may be configured with a thickness of approximately 0.55T. A thickness of the fourth piezoelectric layer 46 as defined between the first electrode 18 and the first piezoelectric layer 12 may be approximately $0.3T_1$ for suppression of the third mode. A thickness of the third piezoelectric layer 48 as defined between the shared electrode 16 and the second piezoelectric layer 14 may be approximately $0.35T_2$ for suppression of the first mode. In this manner, the SCF 54 is configured to distribute stress differently between the top and bottom halves in such a way that mode suppression arrangements do not require additional compensation. Accordingly, each of the first piezoelectric layer 12 and the second piezoelectric layer 14 may both comprise the same electromechanical coupling material values. While the inverted polarity configuration is illustrated in the lower half of the SCF 54 to suppress the third mode (22-3 of FIG. 2B), any suppression configuration described above for FIGS. 7A-7C, including non-piezoelectric layers, thicker electrodes, and combinations thereof may be used.

Figure 17A:
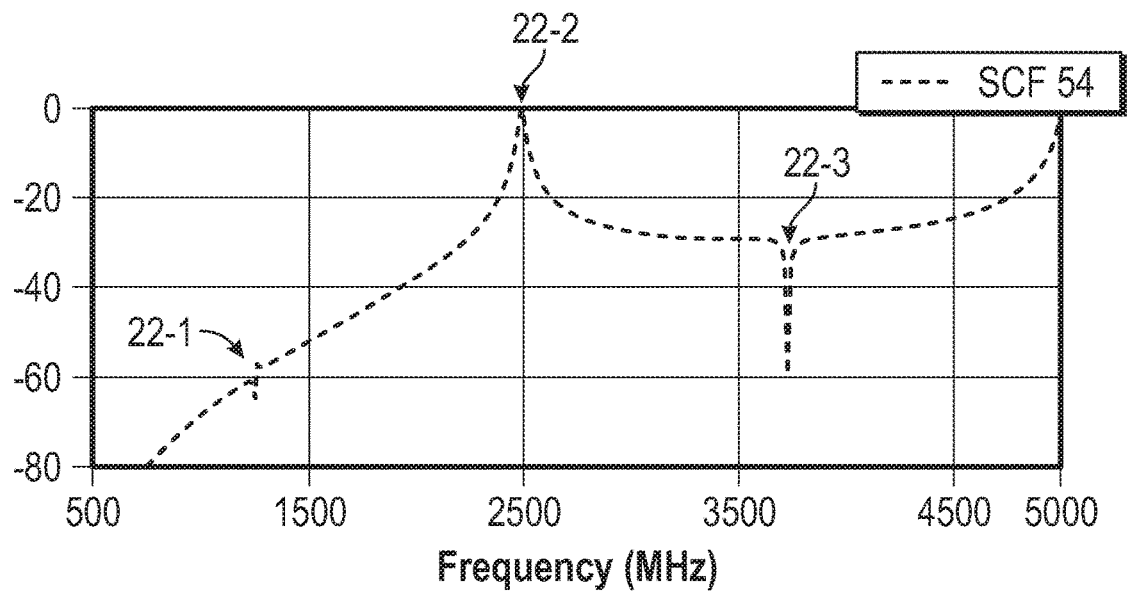
FIG. 17A illustrates the transmission response for the SCF of FIG. 16.
Figure 17B:
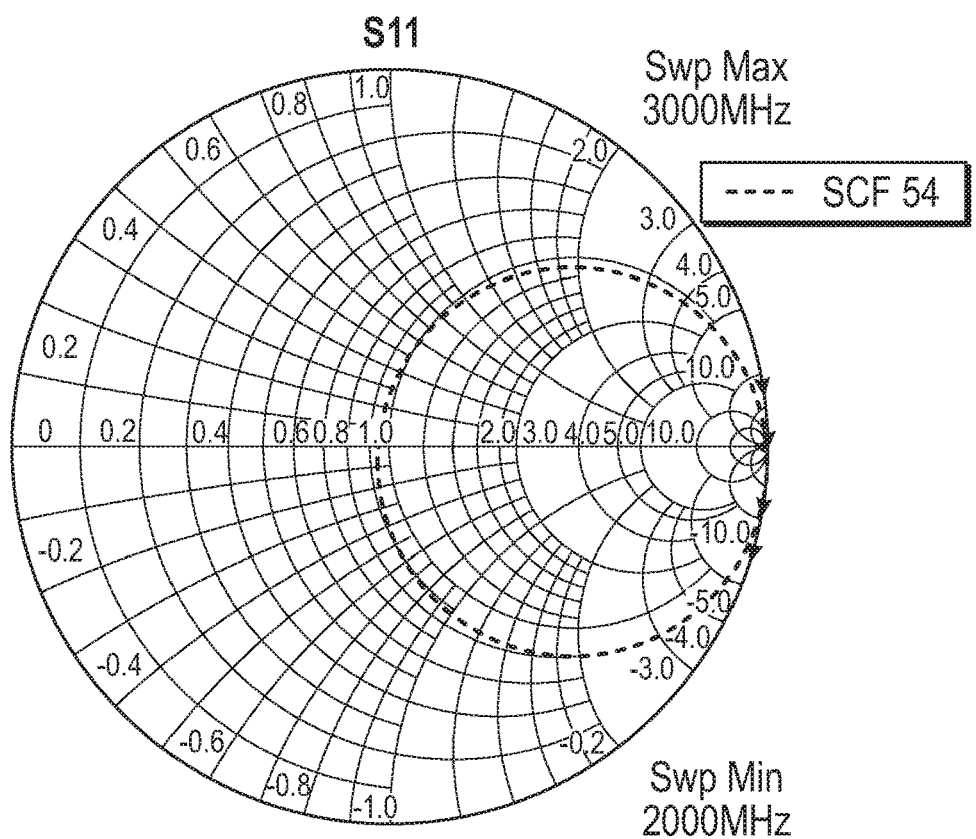
FIG. 17B is a Smith chart illustrating impedance for an input of the SCF of FIG. 16.
Figure 17C:
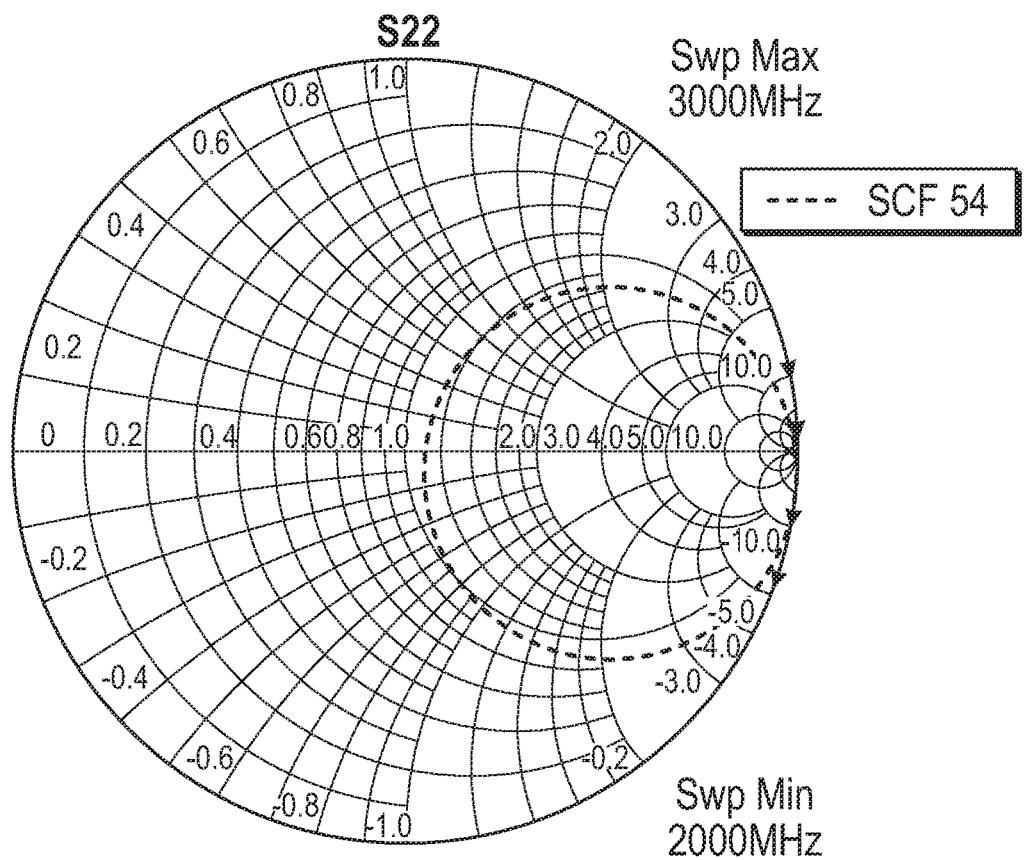
FIG. 17C is a Smith chart comparing impedance for an output of the SCF of FIG. 16.

FIG. 17A illustrates the transmission response for the SCF 54 of FIG. 16. As illustrated, the first mode 22-1 and the third mode 22-3 are suppressed with the second mode 22-2 serving as a main mode for the SCF 54. FIG. 17B is a Smith chart comparing impedance for an input of the SCF 54 of FIG. 16 by scattering parameter $S_{11}$, and FIG. 17C is a Smith chart comparing impedance for an output of the SCF 54 of FIG. 16 by scattering parameter $S_{22}$. As illustrated, the input and output of the SCF 54 are generally symmetric.

Figure 18:
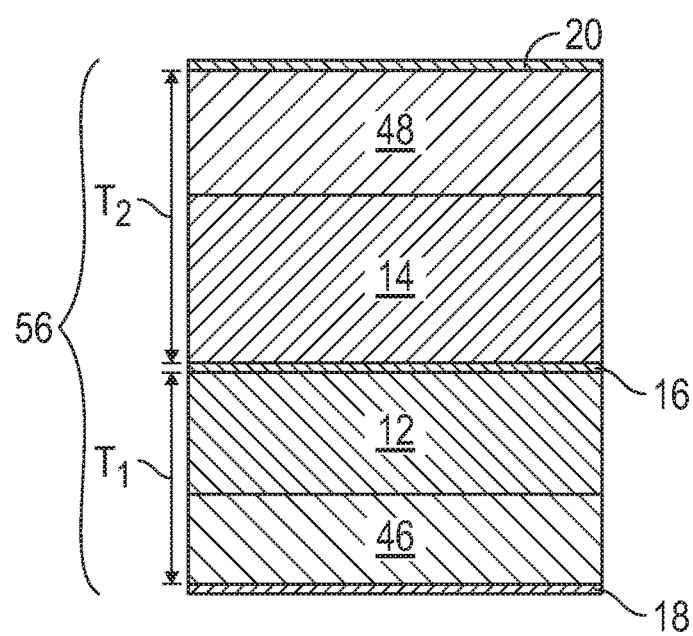
FIG. 18 is a diagram illustrating an SCF that includes mode suppression for the second order mode and the third order mode without requiring compensation configurations.

FIG. 18 is a diagram illustrating an SCF 56 that includes mode suppression for the second mode (22-2 of FIG. 2B) and the third mode (22-3 of FIG. 2B) without requiring compensation configurations. The SCF 56 includes the fourth piezoelectric layer 46 having inverse polarity and the first piezoelectric layer 12 that collectively define a bottom half of the SCF 56. The fourth piezoelectric layer 46 is arranged between the first electrode 18 and the first piezoelectric layer 12 for suppression of the third mode (22-3 of FIG. 2B). The SCF 56 further includes the third piezoelectric layer 48 having inverse polarity and the second piezoelectric layer 14 that collectively define a top half of the SCF 54. The third piezoelectric layer 48 is arranged between the second electrode 20 and the second piezoelectric layer 14 for suppression of the second mode (22-2 of FIG. 2B). In FIG. 18, $T_1$ is the combined thickness of the fourth piezoelectric layer 46 and the first piezoelectric layer 12 as defined by a distance between the first electrode 18 and the shared electrode 16, and $T_2$ is the combined thickness of the third piezoelectric layer 48 and the second piezoelectric layer 14 as defined by a distance between the second electrode 20 and the shared electrode 16. As such, a total thickness T may be defined as the sum of $T_1$ and $T_2$. In certain embodiments, $T_1$ may be configured with a thickness of approximately 0.4T, and $T_2$ may be configured with a thickness of approximately 0.6T. A thickness of the fourth piezoelectric layer 46 as defined between the first electrode 18 and the first piezoelectric layer 12 may be approximately $0.4T_1$ for suppression of the third mode. A thickness of the third piezoelectric layer 48 as defined between the second electrode 20 and the second piezoelectric layer 14 may be approximately $0.4T_2$ for suppression of the second mode. In this manner, the SCF 56 is configured to distribute stress differently between the top and bottom halves in such a way that mode suppression arrangements do not require additional compensation. Accordingly, each the first piezoelectric layer 12 and the second piezoelectric layer 14 may both comprise the same electromechanical coupling material values. While the inverted polarity configuration is illustrated in the lower half of the SCF 56 to suppress the third mode (22-3 of FIG. 2B), any suppression configuration described above for FIGS. 7A-7C, including non-piezoelectric layers, thicker electrodes, and combinations thereof may be used.

Figure 19A:
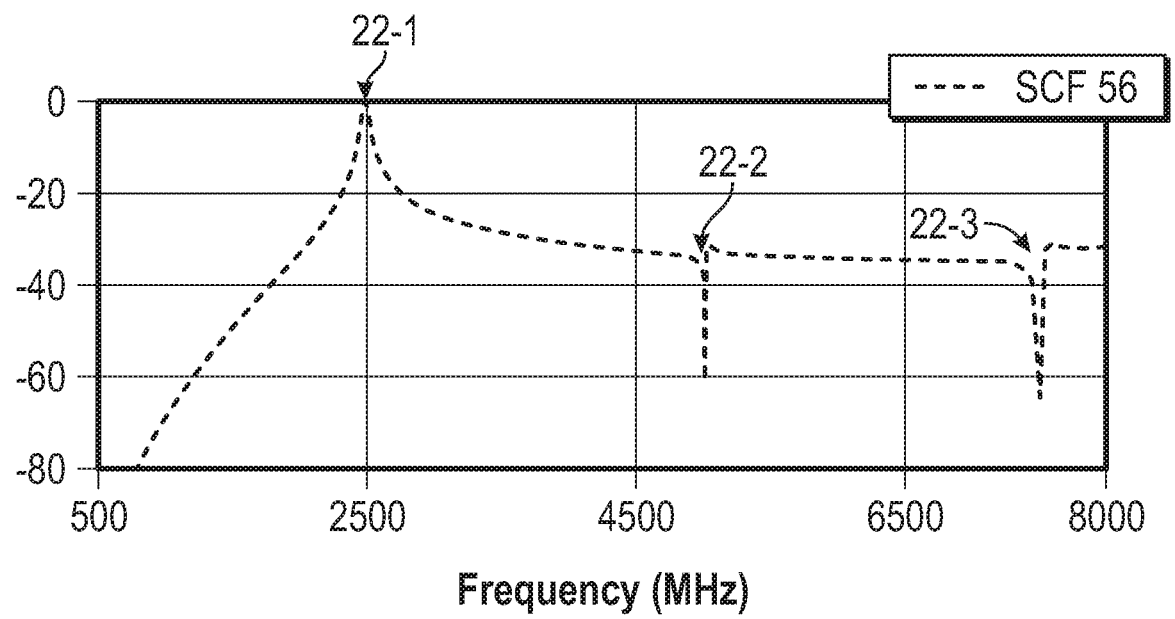
FIG. 19A illustrates the transmission response for the SCF of FIG. 18.
Figure 19B:
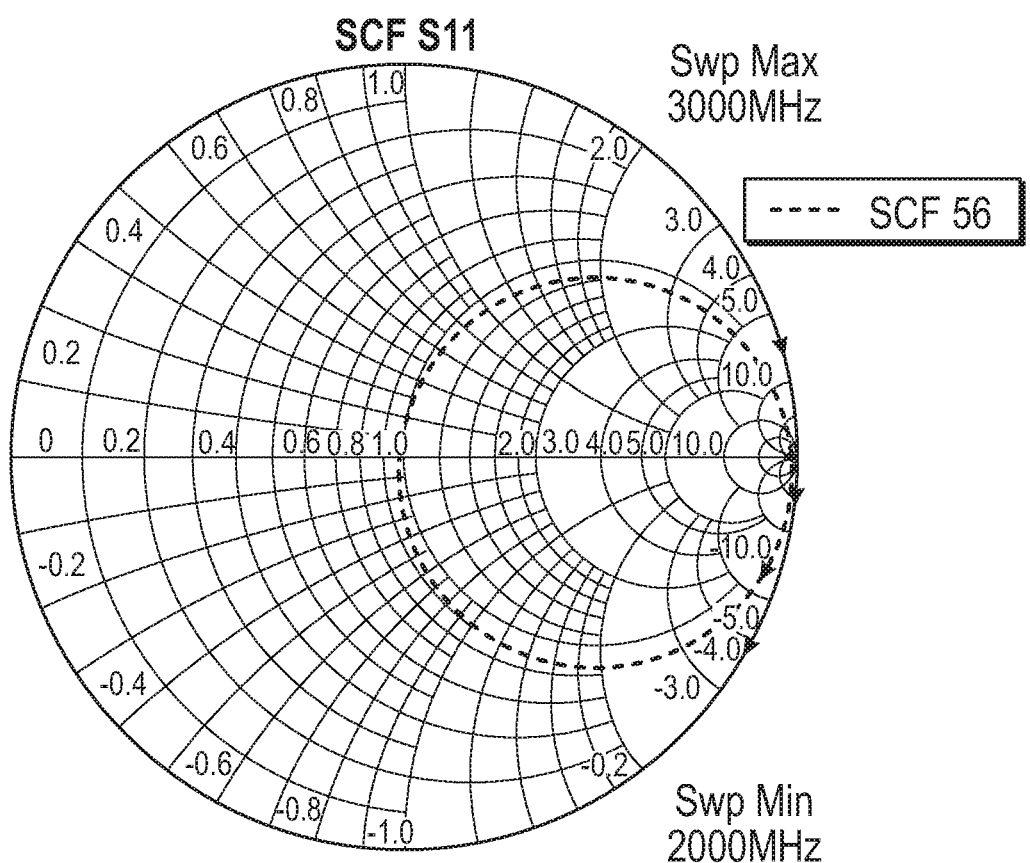
FIG. 19B is a Smith chart illustrating impedance for an input of the SCF of FIG. 18.
Figure 19C:
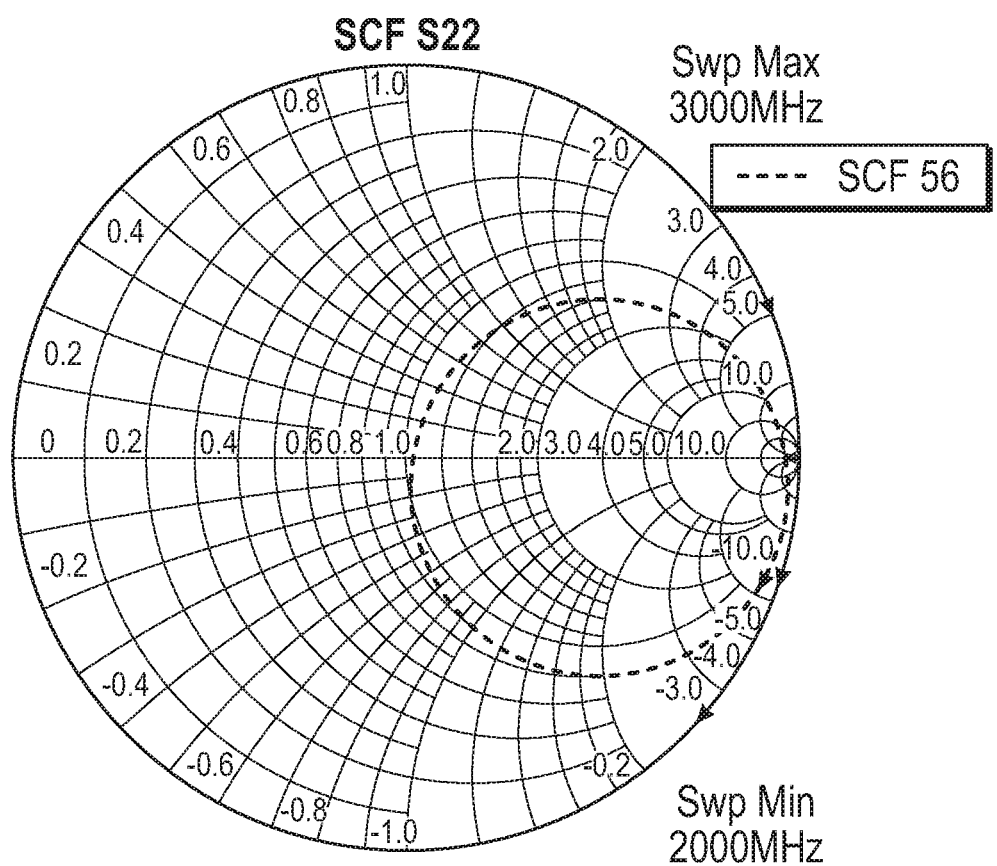
FIG. 19C is a Smith chart comparing impedance for an output of the SCF of FIG. 18.

FIG. 19A illustrates the transmission response for the SCF 56 of FIG. 18. As illustrated, the second mode 22-2 and the third mode 22-3 are suppressed with the first mode 22-1 serving as a main mode for the SCF 56. FIG. 19B is a Smith chart comparing impedance for an input of the SCF 56 of FIG. 18 by scattering parameter $S_{11}$, and FIG. 19C is a Smith chart comparing impedance for an output of the SCF 56 of FIG. 18 by scattering parameter $S_{22}$. As illustrated, the input and output of the SCF 56 are generally symmetric.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An acoustic resonator comprising:
a first piezoelectric layer;
a second piezoelectric layer, wherein the first piezoelectric layer has a different thickness than the second piezoelectric layer;
a shared electrode between the first piezoelectric layer and the second piezoelectric layer;
a first electrode on the first piezoelectric layer opposite the shared electrode;
a second electrode on the second piezoelectric layer opposite the shared electrode; and
a third piezoelectric layer between the second electrode and the shared electrode, the third piezoelectric layer having a polarity that is opposite a polarity of the second piezoelectric layer.

2. The acoustic resonator of claim 1, wherein the third piezoelectric layer is between the second electrode and the second piezoelectric layer.

3. The acoustic resonator of claim 1, wherein the third piezoelectric layer is between the shared electrode and the second piezoelectric layer.

4. The acoustic resonator of claim 1, wherein the second piezoelectric layer has a higher electromechanical coupling than the first piezoelectric layer.

5. The acoustic resonator of claim 1, wherein the first piezoelectric layer has a higher electromechanical coupling than the second piezoelectric layer.

6. The acoustic resonator of claim 1, further comprising a fourth piezoelectric layer between the first electrode and the shared electrode, the fourth piezoelectric layer having a polarity that is opposite a polarity of the first piezoelectric layer.

7. The acoustic resonator of claim 6, wherein the fourth piezoelectric layer is between the shared electrode and the first piezoelectric layer.

8. The acoustic resonator of claim 7, wherein the third piezoelectric layer is between the second electrode and the second piezoelectric layer.

9. The acoustic resonator of claim 6, wherein the fourth piezoelectric layer is between the first electrode and the first piezoelectric layer.

10. The acoustic resonator of claim 9, wherein the third piezoelectric layer is between the second electrode and the second piezoelectric layer.

11. The acoustic resonator of claim 6, wherein the third piezoelectric layer has a different thickness than the fourth piezoelectric layer.

12. The acoustic resonator of claim 6, wherein a combined thickness of the first piezoelectric layer and the fourth piezoelectric layer is different than a combined thickness of the third piezoelectric layer and the second piezoelectric layer.

13. An acoustic resonator comprising:
a first piezoelectric layer;
a second piezoelectric layer;
a shared electrode between the first piezoelectric layer and the second piezoelectric layer;
a first electrode on the first piezoelectric layer opposite the shared electrode;
a second electrode on the second piezoelectric layer opposite the shared electrode; and
a non-piezoelectric layer between the first electrode and the second electrode, wherein the non-piezoelectric layer comprises a dielectric layer.

14. The acoustic resonator of claim 13, wherein the dielectric layer comprises silicon dioxide or silicon nitride.

15. The acoustic resonator of claim 13, wherein the non-piezoelectric layer is between the second electrode and the second piezoelectric layer.

16. The acoustic resonator of claim 13, wherein the non-piezoelectric layer is between the first electrode and the first piezoelectric layer.

17. The acoustic resonator of claim 13, wherein the shared electrode is a metal layer.

18. An acoustic resonator comprising:
a first piezoelectric layer;
a second piezoelectric layer, wherein the first piezoelectric layer has a different thickness than the second piezoelectric layer;
a shared electrode between the first piezoelectric layer and the second piezoelectric layer;
a first electrode on the first piezoelectric layer opposite the shared electrode; and
a second electrode on the second piezoelectric layer opposite the shared electrode, wherein the second electrode is thicker than the first electrode.

19. The acoustic resonator of claim 18, wherein the second electrode is at least fifty percent thicker than the first electrode.

20. The acoustic resonator of claim 18, wherein the second electrode is at least two times thicker than the first electrode.

* * * * *